United States Patent
Shimamura et al.

(10) Patent No.: US 10,615,378 B2
(45) Date of Patent: Apr. 7, 2020

(54) REDUCED-PRESSURE DRYING APPARATUS

(71) Applicant: TOKYO ELECTRON LIMITED, Tokyo (JP)

(72) Inventors: Akinori Shimamura, Yamanashi (JP); Teruyuki Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 15/719,166

(22) Filed: Sep. 28, 2017

(65) Prior Publication Data
US 2018/0097205 A1  Apr. 5, 2018

(30) Foreign Application Priority Data

Sep. 30, 2016  (JP) .................................. 2016-192668
Apr. 14, 2017  (JP) .................................. 2017-080486

(51) Int. Cl.
| F26B 5/04 | (2006.01) |
| H01L 51/56 | (2006.01) |
| F26B 3/30 | (2006.01) |
| F26B 9/06 | (2006.01) |
| H01L 51/00 | (2006.01) |

(52) U.S. Cl.
CPC .............. *H01L 51/56* (2013.01); *F26B 3/30* (2013.01); *F26B 5/04* (2013.01); *F26B 5/042* (2013.01); *F26B 9/06* (2013.01); *H01L 51/0007* (2013.01); *H01L 51/0025* (2013.01)

(58) Field of Classification Search
CPC ....... H01L 51/0001; F26B 5/04; F26B 11/049
USPC .................. 34/406, 403, 407, 408, 538, 559
See application file for complete search history.

(56) References Cited

U.S. PATENT DOCUMENTS

| 5,273,589 A * | 12/1993 | Griswold .................. B08B 3/10 |
| | | 134/105 |
| 2007/0006556 A1* | 1/2007 | Bruck ................ B01D 39/2044 |
| | | 55/282.2 |
| 2011/0300657 A1 | 12/2011 | Chesterfield et al. |
| 2016/0141635 A1* | 5/2016 | Kanno ................ H01M 8/0232 |
| | | 429/514 |
| 2017/0141310 A1* | 5/2017 | Madigan ............. C23C 18/1291 |

FOREIGN PATENT DOCUMENTS

| JP | 2010-169308 A | 8/2010 |
| JP | 2014-199806 A | 10/2014 |
| JP | 5701782 B2 | 2/2015 |
| KR | 10-2014-0143331 A | 12/2014 |

OTHER PUBLICATIONS

Explaining Expanded Metal Mesh, Feb. 26, 2015, Niles Fence & Security Products, www.nilesfence.com/files/technical-information-mesh.pdf (Year: 2105).*

* cited by examiner

*Primary Examiner* — John P McCormack
(74) *Attorney, Agent, or Firm* — Fenwick & West LLP

(57) ABSTRACT

A reduced-pressure drying apparatus, for drying solution on a substrate in a chamber in a depressurized state, includes a solvent collecting unit that is a net-shaped plate configured to temporarily collect a solvent in the solution vaporized from the substrate. The solvent collecting unit is provided to face the substrate in the chamber, and the net-shaped plate has an opening ratio of 60% to 80% and a thermal capacity of 850 J/K or less per 1 $m^2$.

20 Claims, 13 Drawing Sheets

NET: 23°C
SUBSTRATE: 23°C
CHAMBER PRESSURE: ATMOSPHERIC PRESSURE

NET: 8°C TO 15°C
SUBSTRATE: 23°C
CHAMBER PRESSURE: 10 Pa

NET: 8°C TO 15°C
SUBSTRATE: 23°C
CHAMBER PRESSURE: 0.2 Pa

NET: 18°C TO 23°C
SUBSTRATE: 23°C
CHAMBER PRESSURE: 0.05 Pa

REDUCED-PRESSURE DRYING APPARATUS

CROSS-REFERENCE TO RELATED APPLICATIONS

This application claims priority to Japanese Patent Application No. 2016-192668 and No. 2017-080468 respectively filed on Sep. 30, 2016 and Apr. 14, 2017, the entire contents of which are incorporated herein by reference for all purposes.

FIELD OF THE INVENTION

Embodiments of the disclosure relate to a reduced-pressure drying apparatus for drying liquid on a substrate accommodated in a chamber in a depressurized state.

BACKGROUND OF THE INVENTION

An OLED (Organic Light Emitting Diode) is a light emitting diode using light emission of organic EL (Electroluminescence). An organic EL display using OLEDs is typically thin and light in weight and consumes relatively low power. Further, an organic EL display usually has an excellent response speed, viewing angle and contrast ratio. Therefore, organic EL displays recently attract attention as a next generation flat panel display (FPD).

In an OLED, an organic EL layer is embedded between a cathode and an anode on a substrate. The organic EL layer is formed by laminating a hole injection layer, a hole transport layer, a light emitting layer, an electron transport layer and an electron injection layer in that order from the anode side, for example. To form the respective sub-layers (particularly, the hole injection layer, the hole transport layer and the light emitting layer) of the organic EL layer, in one method, liquid droplets of an organic material are discharged onto the substrate by an inkjet method, for example.

The organic material discharged onto the substrate by the inkjet method contains a large amount of solvent. Accordingly, a reduced-pressure drying process for drying the liquid on the substrate in a depressurized state is performed to remove the solvent (see, e.g., Japanese Patent Application Publication Nos. 2014-199806 and 2010-169308, and Japanese Patent No. 5701782).

More specifically, a drying apparatus disclosed in Japanese Patent Application Publication No. 2014-199806 includes: an evacuable processing chamber; a mounting table for supporting a substrate in the processing chamber; and a solvent collecting unit, facing the substrate supported on the mounting table, for collecting solvent volatilized from an organic material film on the substrate.

The solvent collecting unit of the drying apparatus disclosed in Japanese Patent Application Publication No. 2014-199806 has a metallic collecting plate disposed substantially in parallel with a surface of the substrate. A through-hole is formed in the collecting plate. Further, the drying apparatus disclosed in Japanese Patent Application Publication No. 2014-199806 includes a solvent separation device for separating the solvent collected by the collecting plate from the collecting plate by vaporizing the solvent after the drying process. The drying apparatus disclosed in Japanese Patent Application Publication No. 2014-199806 further includes a temperature control device having a peltier element or the like, for controlling a temperature of the collecting plate.

In a drying apparatus disclosed in Japanese Patent Application Publication No. 2010-169308, a porous adsorption member for adsorbing a solvent in solution evaporated during drying is disposed to face a substrate. Further, Japanese Patent Application Publication No. 2010-169308 discloses therein another drying apparatus for drying the adsorption member, in addition to the drying apparatus for adsorbing and drying the solvent in the solution on the substrate. In this drying apparatus, a temperature control unit is provided at a mounting table for mounting the adsorption member.

To shorten the treatment time in the drying apparatus which includes the time for separating the solvent collected by and adsorbed onto the solvent collecting unit, it is important to improve the efficiency of collecting the solvent in the solvent collecting unit or improve the efficiency of vaporizing the solvent from the solvent collecting unit.

However, the drying apparatus disclosed in Japanese Patent Application Publication No. 2014-199806 has a complicated configuration as it uses a temperature control unit for cooling or heating the collecting plate to improve the efficiency of collecting the solvent in the solvent collecting unit, i.e., the collecting plate, or the efficiency of vaporizing the solvent from the collecting plate.

The apparatus disclosed in Japanese Patent Application Publication No. 2010-169308 also has a complicated configuration because the temperature control unit is provided at the mounting table for mounting the substrate to facilitate the vaporization of the solvent from the solvent collecting unit, i.e., the adsorption unit. In addition, another drying apparatus for drying the adsorption member, which is different from the drying apparatus for drying the substrate, is used in the technique disclosed in Japanese Patent Application Publication No. 2010-169308.

Japanese Patent No. 5701782 does not disclose any information thereon.

SUMMARY OF THE INVENTION

In view of the above, the present disclosure provides a reduced-pressure drying apparatus having a simple configuration and enables both reduced-pressure drying of the solvent on the substrate and separation of the solvent from the solvent collecting unit with improved efficiencies.

In accordance with an aspect, a reduced-pressure drying apparatus is configured to dry solution on a substrate in a chamber in a depressurized state. The apparatus includes: a solvent collecting unit including a net-shaped plate that is configured to temporarily collect a solvent in the solution vaporized from the substrate, where the solvent collecting unit is disposed to face the substrate in the chamber, where, when a pressure in the chamber is decreased to a level lower than or equal to a vapor pressure of the solvent at the substrate temperature, a temperature of the solvent collecting unit is decreased to a level lower than or equal to a dew point of the solvent at the pressure in the chamber at that time by a gas in the chamber which is adiabatically expanded by depressurization, where the temperature of the solvent collecting unit is maintained at the level lower than or equal to the dew point of the solvent at the pressure in the chamber at each timing until vaporization of the solvent of the solution on the substrate is completed, and where within five minutes after completion of the vaporization of the solvent of the solution on the substrate, the temperature of the solvent collecting unit is increased to a level higher than the dew point of the solvent at the pressure in the chamber at that time by radiant heat from the chamber.

In accordance with another aspect, there is provided a reduced-pressure drying apparatus for drying solution on a substrate in a chamber in a depressurized state, which including: a solvent collecting unit that is a net-shaped plate configured to temporarily collect a solvent in the solution vaporized from the substrate, where the solvent collecting unit is provided to face the substrate in the chamber, and the net-shaped plate has an opening ratio of 60% to 80% and a thermal capacity of 850 J/K or less per 1 m$^2$.

In accordance with still another aspect, there is provided a reduced-pressure drying apparatus configured to dry solution on a substrate in a chamber in a depressurized state, which including: a solvent collecting unit that is a net-shaped plate configured to temporarily collect a solvent in the solution vaporized from the substrate, where the solvent collecting unit is positioned to face the substrate in the chamber, and where a distance from the substrate to the solvent collecting unit is 40% to 60% of a distance from the substrate to a structure above the solvent collecting unit.

In accordance with the present disclosure, the reduced-pressure drying of the solvent on the substrate and the separation of the solvent from the solvent collecting unit can be performed within a short period of time by the simple configuration of the apparatus. Further, in accordance with the present disclosure, the drying time of the solvent is uniform across the substrate.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1A:
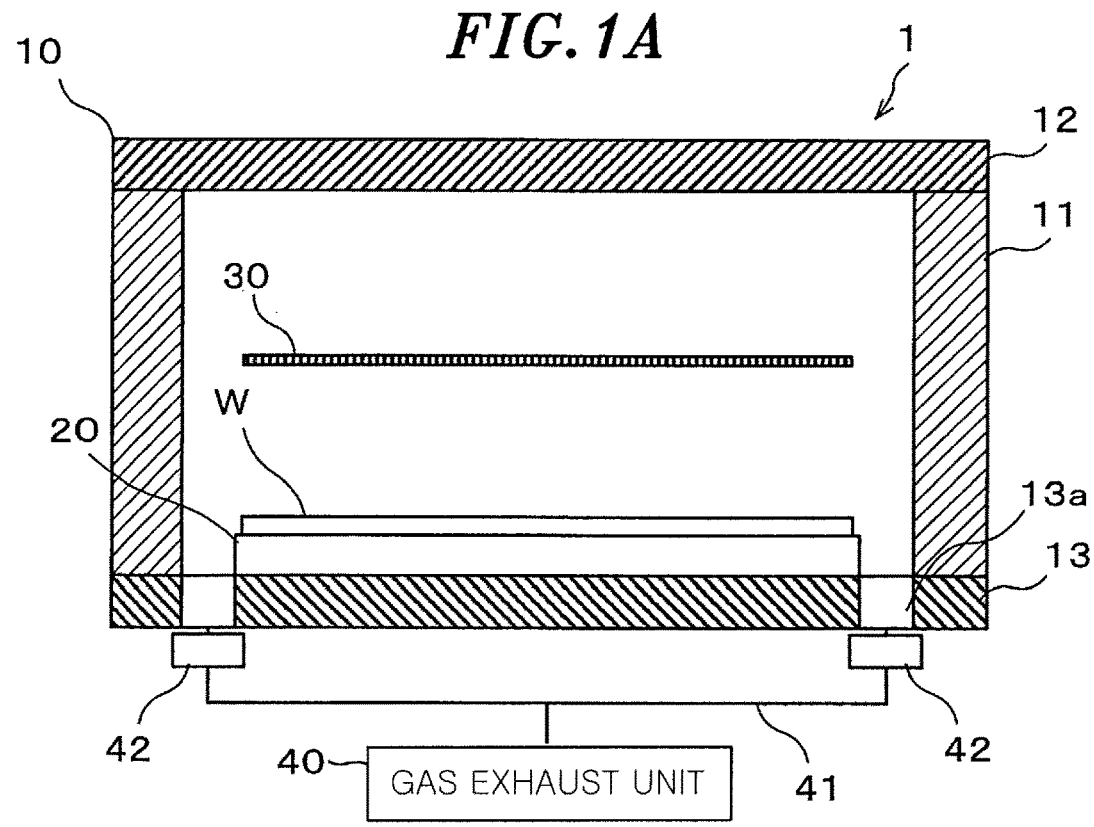
FIGS. 1A and 1B show a configuration of an exemplary reduced-pressure drying apparatus according to a first embodiment.

Hereinafter, embodiments will be described with reference to the accompanying drawings. In this specification and the drawings, like reference numerals will be used for like parts having substantially the same functions and redundant description thereof will be omitted. The present disclosure is not limited by the following embodiments.

First Embodiment

Figure 1B:
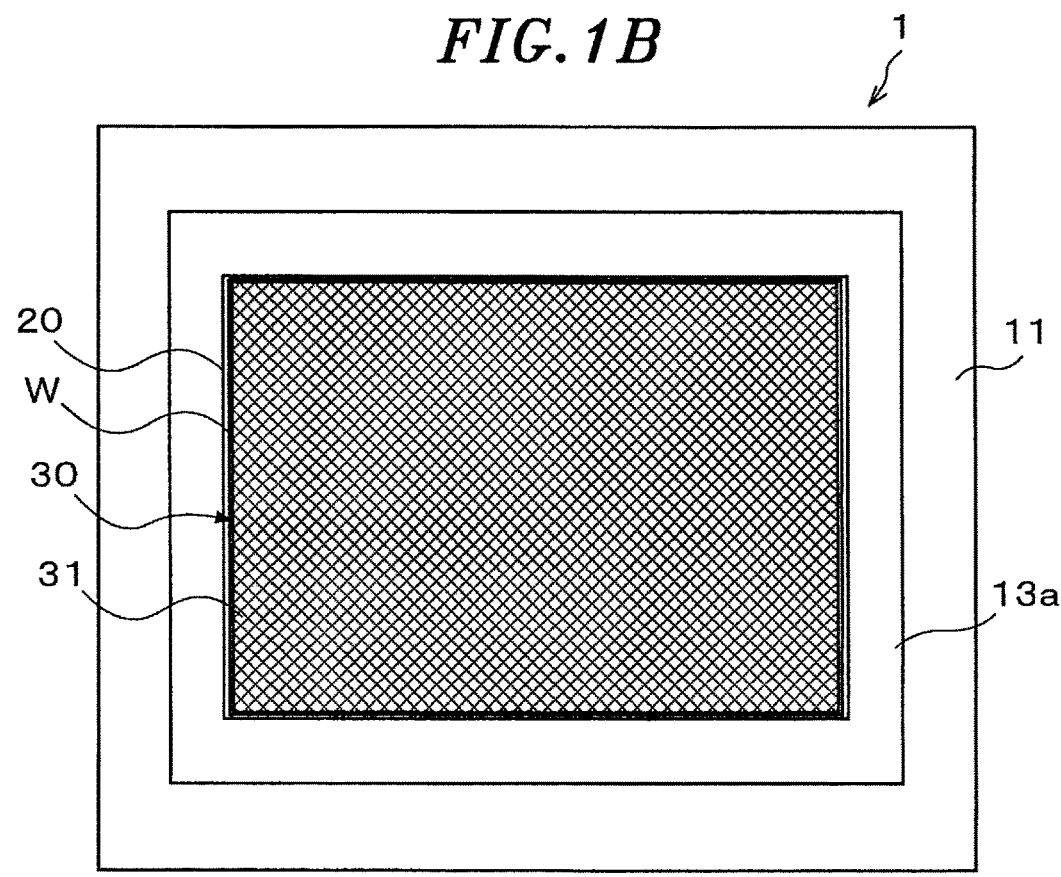
Figure 2A:
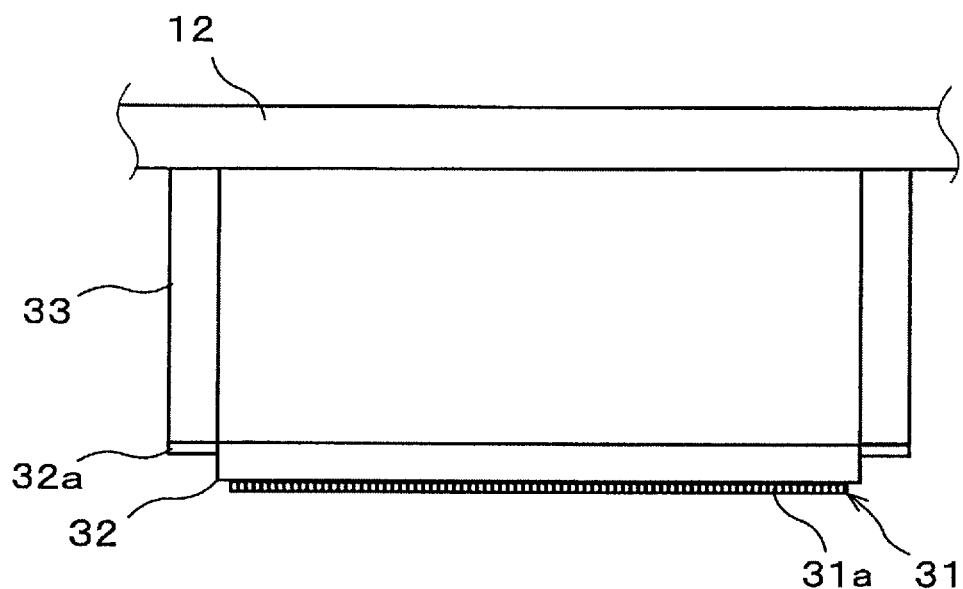
FIGS. 2A and 2B illustrate an exemplary fixing structure of a solvent collecting unit.
Figure 2B:
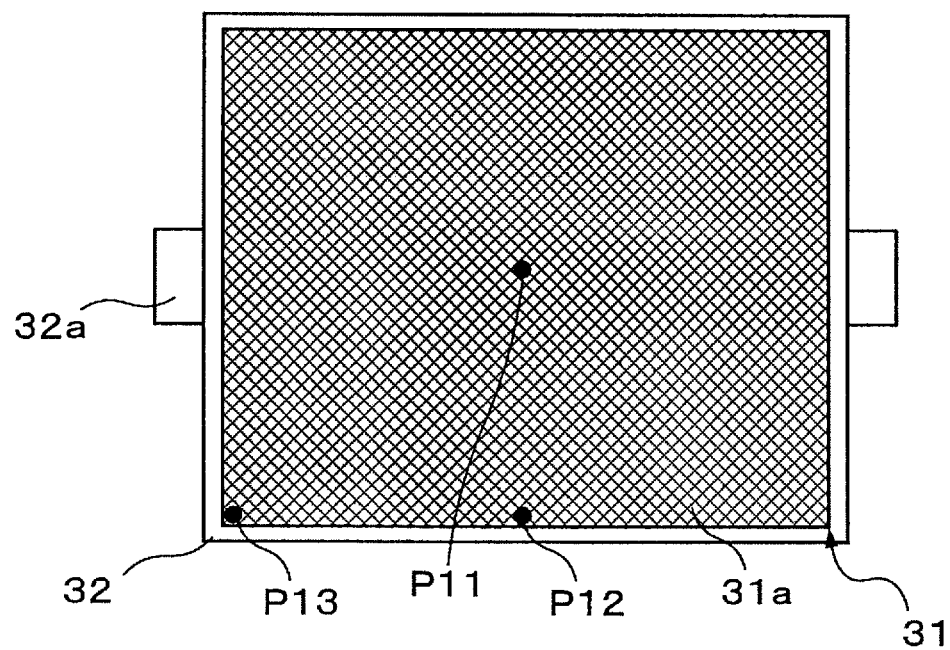

FIGS. 1A and 1B show a configuration of an exemplary reduced-pressure drying apparatus according to a first embodiment. FIG. 1A is a cross sectional view showing the configuration of the exemplary reduced-pressure drying apparatus. FIG. 1B is a top view showing a configuration inside the exemplary reduced-pressure drying apparatus. In FIG. 1A, the structure for supporting a solvent collecting unit (to be described below) is not illustrated. In FIG. 1B, a top plate and the like (described in detail below) are not illustrated. FIGS. 2A and 2B illustrate a fixing structure of the solvent collecting unit. FIG. 2A is a partial side view of an inside of the exemplary reduced-pressure drying apparatus. FIG. 2B is a partial bottom view of the vicinity of the solvent collecting unit in the exemplary reduced-pressure drying apparatus.

The reduced-pressure drying apparatus of the present embodiment dries solution coated on the substrate by an inkjet method in a depressurized state. The substrate used as a processing target of this apparatus can be, e.g., a glass substrate for an organic EL display.

The solution coated on the substrate as the processing target of this apparatus contains a solute and a solvent. The reduced-pressure drying process is used to remove the solvent. An organic compound contained in the solvent mostly has a high boiling point. This organic compound may be, e.g., 1, 3-dimethyl-2-imidazolidinone (boiling point 220° C., melting point 8° C.), 4-tert-Butylanisole (boiling point 222° C., melting point 18° C.), Trans-Anethole (boiling point 235° C., melting point 20° C.), 1, 2-Dimethoxybenzene (boiling point 206.7° C., melting point 22.5° C.), 2-Methoxybiphenyl (boiling point 274° C., melting point 28° C.), Phenyl Ether (boiling point 258.3° C., melting point 28° C.), 2-Ethoxynaphthalene (boiling point 282° C., melting point 35° C.), Benzyl Phenyl Ether (boiling point 288° C., melting point 39° C.), 2, 6-Dimethoxytoluene (boiling point 222° C., melting point 39° C.), 2-Propoxynaphthalene (boiling point 305° C., melting point 40° C.), 1,2,3-Trimethoxybenzene (boiling point 235° C., melting point 45° C.), cyclohexylbenzene (boiling point 237.5° C., melting point 5° C.), dodecylbenzene (boiling point 288° C., melting point −7° C.), 1, 2, 3, 4-tetramethylbenzene (boiling point 203° C., melting point 76° C.) or the like. Two or more of these organic compounds having a high boiling point may be combined and contained in the solution.

As shown in FIGS. 1A and 1B, the reduced-pressure drying apparatus of the present embodiment includes a chamber 10, a mounting table 20, and a solvent collecting unit 30. Further, the reduced-pressure drying apparatus of the present embodiment is coupled to a gas exhaust unit 40.

The chamber 10 is airtightly formed and made of a metal such as stainless steel or the like. The chamber 10 has a square tube-shaped main body 11, a top plate 12 attached to an upper portion of the main body 11, and a bottom plate 13 attached to a lower portion of the main body 11.

The main body 11 includes a loading/unloading port (not shown) for loading/unloading the substrate W into/from the chamber 10.

The top plate 12 blocks an opening formed at the upper portion of the main body 11 and supports the solvent collecting unit 30. A supporting structure for the solvent collecting unit 30 is described in greater detail below.

The bottom plate 13 blocks an opening formed at the lower portion of the main body 11. The mounting table 20 is disposed at an upper central portion of the bottom plate 13. A gas exhaust port 13a is formed in the bottom plate 13 to surround an outer periphery of the mounting table 20. The gas exhaust unit 40 is coupled to the gas exhaust port 13a through a gas exhaust line 41. The pressure in the chamber 10 can be reduced through the gas exhaust port 13a.

The mounting table 20 mounts thereon the substrate W. The mounting table 20 includes elevating pins (not shown) for delivering the substrate W. The elevating pins can be vertically moved by an elevation unit.

The solvent collecting unit 30 collects the solvent vaporized from the solution coated on the substrate W by an inkjet method and thereby controls vapor concentration of the solvent in the chamber 10.

The solvent collecting unit 30 has a solvent collecting plate (hereinafter, referred to as "solvent collecting net") 31 that is a thin plate in which lattice-shaped openings are uniformly formed, e.g., a net-shaped plate.

The solvent collecting net 31 is preferably made of a metal having high thermal conductivity, such as stainless steel, aluminum, copper, gold or the like. More specifically, the solvent collecting net 31 is, e.g., an expanded metal manufactured by slitting and expanding a steel plate. The solvent collecting net 31 may be made of a single expanded metal. However, in this example, the solvent collecting net 31 is formed by arranging a plurality of expanded metals in a horizontal direction.

The thickness of the solvent collecting net 31 is, e.g., 0.1 mm. A horizontal dimension of the solvent collecting net 31 is substantially equal to that of the substrate W. More specifically, a horizontal dimension of the entire expanded metals forming the solvent collecting net 31 is substantially equal to that of the substrate W. The horizontal dimension of the solvent collecting net 31 may be greater than that of the substrate W to increase the capacity of absorbing the vaporized solvent. When the solvent collecting net 31 is installed above the center of the substrate W, the horizontal dimension of the solvent collecting net 31 may be smaller than that of the substrate W to control balance of concentration of vapor in the chamber 10.

The solvent collecting net 31 has a large opening ratio, e.g., 65%. The opening ratio denotes a ratio of (total area of the opening of the solvent collecting net 31 when viewed from the top)/(entire area of the solvent collecting net 31 when viewed from the top).

As described above, the solvent collecting net 31 is thin and formed in a net shape having a high opening ratio. Therefore, the thermal capacity per 1 $m^2$ can be low, e.g., 372 J/K. In other words, a thermal capacity per unit area can be low, e.g., 372 J/K·$m^2$.

The solvent collecting net 31 is supported between the substrate W and the top plate 12 that is a structure positioned above the solvent collecting net 31 and proximate (e.g., closest) to the solvent collecting net 31. Further, the solvent collecting net 31 is supported by the top plate 12 while facing the substrate W directly, e.g., while being in substantially parallel with the substrate W.

As shown in FIG. 2, the solvent collecting net 31 is supported by the top plate 12 through a frame body 32 and leg parts 33. This is described in greater detail hereinafter.

An expanded metal 31a forming the solvent collecting net 31 is fixed to the square tube-shaped frame body 32 by welding or the like. The expanded metal 31a, i.e., the solvent collecting net 31, is supported by the top plate 12 by fixing ear parts 32a disposed at an outer side of the frame body 32 to the leg parts 33 expending downward from the top plate 12 by using screws or the like.

The frame body 32 and the leg parts 33 are made of a metal such as stainless steel or the like.

Further, the frame body 32 and the leg parts 33 are located at a side of the solvent collecting net 31 opposite to the side where the substrate W is located with the solvent collecting net 31 interposed therebetween. Therefore, the entire surface of the solvent collecting net 31 is exposed to the substrate W. Accordingly, the flow of the vaporized solvent from the substrate W toward the solvent collecting net 31 would not be disturbed by the frame body 32 and the leg parts 33. To make the flow of the vaporized solvent more uniform, it is preferable to reduce the volume of the frame body 32 and the leg parts 33.

Referring back to FIG. 1, the gas exhaust unit 40 includes a vacuum pump. More specifically, a turbo molecular pump and a dry pump are connected in series in that order from an upstream side, for example. The gas exhaust unit 40 is disposed below a central portion of the bottom plate 13, e.g., below a central portion of the substrate W.

An APC (Adaptive Pressure Control) valve 42 is disposed between the gas exhaust unit 40 and the gas exhaust port 13a and in the gas exhaust line 41. In the reduced-pressure drying apparatus 1, a vacuum level in the chamber during an exhaust operation can be controlled by controlling an opening of the APC valve 42 in a state that the vacuum pump of the gas exhaust unit 40 is activated.

The reduced-pressure drying apparatus 1 further includes a pressure gauge (not shown) for measuring a pressure in the chamber 10. A measurement result from the pressure gauge is input as an electrical signal into the APC valve 42.

The reduced-pressure drying apparatus 1 further includes a control unit (not shown). The control unit is, e.g., a computer, and has a program storage unit (not shown). A program for controlling a reduced-pressure drying process in the reduced-pressure drying apparatus 1 is stored in the program storage unit. Further, the program may be stored in a computer-readable storage medium, e.g., hard disk (HD), a flexible disk (FD), a compact disk (CD), a magneto-optical disk (MO), a memory card or the like and installed from the storage medium to the control unit.

Figure 3A:
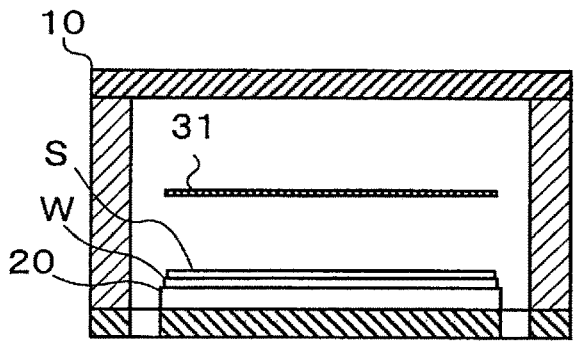
FIGS. 3A to 3D illustrate an exemplary reduced-pressure drying process using the reduced-pressure drying apparatus shown in FIG. 1.
Figure 3B:
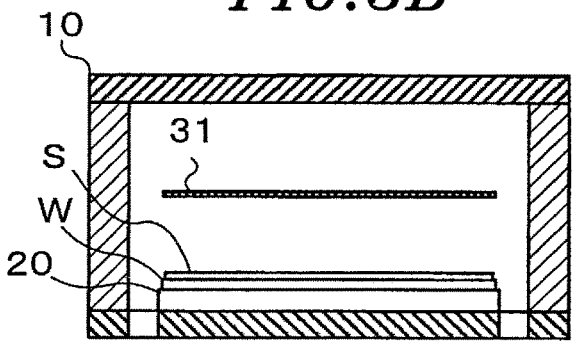
Figure 3C:
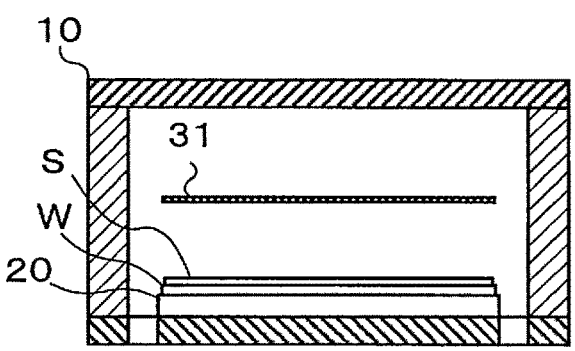
Figure 3D:
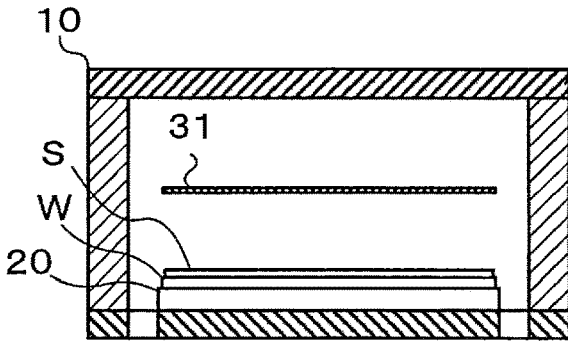
Figure 4:
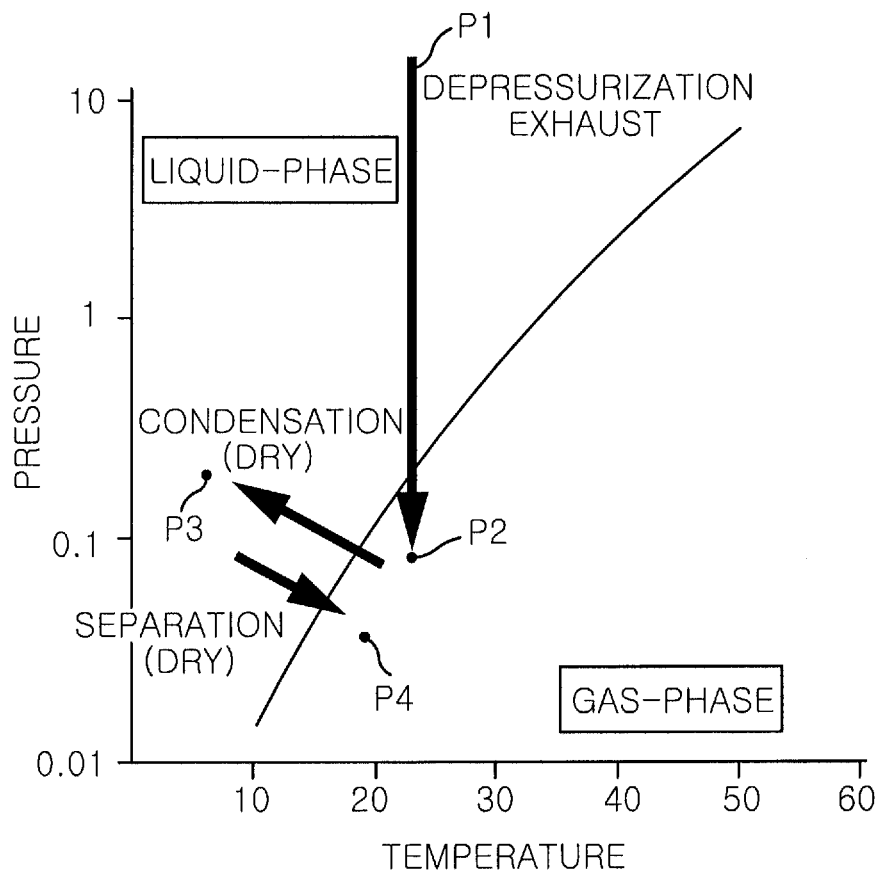
FIG. 4 shows a sample vapor pressure curve of a solvent in solution coated on a substrate W.

The reduced-pressure drying process performed in the exemplary reduced-pressure drying apparatus 1 is described in detail with reference to FIGS. 3A to 3D and 4. FIGS. 3A to 3D illustrate the exemplary reduced-pressure drying process. FIGS. 3A to 3D show the condition in the chamber 10 in each step of the reduced-pressure drying process. FIG. 4 shows a vapor pressure curve of a solvent in solution coated on the substrate W. The horizontal axis represents a temperature and the vertical axis represents a pressure.

In the reduced-pressure drying process, the substrate W coated with processing solution by an inkjet method is loaded on the mounting table 20. In that state, the substrate W and the solvent collecting net 31 are at the room temperature, e.g., 23° C., as shown in FIG. 3A. Further, With the substrate W being mounted on the mounting table 20, the chamber 10 is at the atmospheric pressure (about $10 \times 10^4$ Pa) which is higher than a saturation vapor pressure of the solvent S at the temperature of the substrate W of 23° C. as can shown in FIG. 4. Therefore, the evaporation speed of the solvent S from the substrate W is low.

Next, the chamber 10 is exhausted by operating the dry pump of the gas exhaust unit 40 until the pressure in the chamber 10 reaches approximately 10 Pa.

During the exhaust operation, the gas in the chamber 10 is cooled by adiabatic expansion. However, even with the gas in the chamber 10 being cooled, the temperature of the substrate W hardly changes from 23° C. (the room temperature) due to a large thermal capacity of the substrate W or the like. On the other hand, the temperature of the solvent collecting net 31 is decreased due to its small thermal capacity. More specifically, when the exhaust operation using the dry pump is completed and the pressure in the chamber 10 becomes 10 Pa, the temperature of the solvent collecting net 31 is decreased to, e.g., 8° C. to 15° C., as shown in FIG. 3B.

As indicated by the point P1 in FIG. 4, the pressure in the chamber 10 at the time of completion of the exhaust operation using the dry pump, e.g., 10 Pa, is higher than the saturation vapor pressure of the solvent S at the temperature of the substrate W of 23° C. Therefore, the evaporation speed at the time of completion of the exhaust operation using the dry pump is not sufficiently high.

After the pressure in the chamber 10 becomes 10 Pa by the exhaust operation using the dry pump of the gas exhaust unit 40, the exhaust operation is further performed by the turbo molecular pump of the gas exhaust unit 40.

When the pressure in the chamber 10 becomes lower than or equal to 0.2 Pa which is the vapor pressure of the solvent at the temperature of the substrate W of 23° C. by the exhaust operation as indicated by the point P2 in FIG. 4, the evaporation speed of the solvent S on the substrate W is increased.

At this time, the solvent collecting net 31 is cooled by the exhaust operation as described above. When the pressure in the chamber 10 is reduced to 0.2 Pa, the temperature of the solvent collecting net 31 is, e.g., 8° C. to 15° C., as can be seen from FIG. 3C. As clearly indicated by the point P3 in FIG. 4, the temperature of 8° C. to 15° C. is lower than a dew point of the solvent at 0.2 Pa.

The temperature of the solvent collecting net 31 is maintained at a level lower than or equal to the dew point of the solvent S at a pressure in the chamber 10 at each timing until the evaporation of the solvent S on the substrate W is completed.

Therefore, the solvent vaporized from the substrate W can be collected by the solvent collecting net 31 with high efficiency, and the concentration of the gaseous solvent in the chamber 10 is maintained at a low level. As a result, the solvent on the substrate W can be advantageously removed quickly.

Even after the solvent S on the substrate W is removed, the exhaust operation using the turbo molecular pump of the gas exhaust unit 40 may continue. This helps remove the solvent from the solvent collecting net 31.

If the exhaust operation using the turbo molecular pump is continued as described above, the temperature of the solvent collecting net 31 having a small thermal capacity can be increased by radiant heat from the top plate 12 of the chamber 10, the substrate W or the like. More specifically, within five minutes after the completion of the evaporation of the solvent S on the substrate W, the temperature of the solvent collecting net 31 is increased up to 18° C. to 23° C. which is higher than or equal to the dew point of the solvent at the pressure (0.05 Pa) of the chamber 10 at that time, as can be seen from FIG. 3D and as indicated by the point P4 in FIG. 4. Therefore, the solvent can be effectively removed or separated from the solvent collecting net 31.

It is preferable that the period of time from the evaporation of the solvent S on the substrate W being completed until the temperature of the solvent collecting net 31 becomes higher than or equal to the dew point of the solvent at the pressure in the chamber 10 at that time does not exceed five minutes. If it exceeds five minutes, a long period of time is needed for completely separating the solvent from the solvent collecting net 31. Accordingly, tact time is increased.

Further, it is preferable that the period of time required from the evaporation of the solvent S on the substrate W is completed until the temperature of the solvent collecting net 31 becomes higher than or equal to the dew point of the solvent at the pressure in the chamber 10 at that time is 20 seconds or more. This is because the solvent S on the substrate W can be completely dried after 10 seconds from the start of the evaporation. Thus, it is preferable that the solvent collecting net 31 is slowly dried for at least 10 seconds, preferably at least 20 seconds. If it is less than 20 seconds, when the solvent adsorbed on the solvent collecting net 31 is vaporized, the dried coating film on the substrate W may be melt by the vaporized solvent or the vaporized solvent may be adsorbed by the substrate W.

The exhaust operation using the turbo molecular pump continues until a predetermined period of time elapses after the temperature of the solvent collecting net 31 becomes equal to or higher than the dew point of the solvent at the pressure of the chamber 10 at that time as described above. Then, the drying process of the solvent collecting net 31 in which the solvent is removed from the solvent collecting net 31 is completed.

Upon completion of the drying process by using the solvent collecting net 31, the gas exhaust unit 40 can be stopped. Then, the pressure in the chamber 10 is returned to the atmospheric pressure and the substrate W is unloaded from the chamber 10. Then, the reduced-pressure drying process in the reduced-pressure drying apparatus 1 is completed.

In the reduced-pressure drying apparatus 1, a net-shaped plate having a small thermal capacity is used as the solvent collecting unit 30. Therefore, it is not needed to provide an additional mechanism for cooling/heating the solvent collecting unit 30 in the reduced-pressure drying process. Accordingly, in the reduced-pressure drying apparatus 1, the processing time including time required for drying the substrate (hereinafter, referred to as "drying time") and drying time of the solvent collecting net 31 can be advantageously shortened by the simple configuration. In other words, the reduced-pressure drying of the solvent on the substrate and the separation of the solvent from the solvent collecting unit 30 can be accomplished within a short period of time by the simple configuration.

In the reduced-pressure drying apparatus 1, to further shorten the drying time of the substrate, as described above, the temperature of the solvent collecting net 31 is made to become lower than or equal to the dew point (e.g., the room temperature) at the pressure at the time that the pressure in the chamber 10 becomes lower than or equal to the vapor pressure at the temperature of the substrate W, e.g., at the room temperature. Further, it is maintained at a level lower than or equal to the dew point until the vaporization is completed.

Further, in the reduced-pressure drying apparatus 1, to further shorten the drying time of the solvent collecting net 31, within five minutes from the completion of the evaporation, the temperature of the solvent collecting net 31 is made to become higher than or equal to the dew point at the pressure at that time, as described above.

It is preferable that the drying time of the substrate is uniform in the same substrate. When the solvent collecting net 31 is not provided, the drying time of the substrate W is not uniform in the same substrate. For example, the drying time may be shorter at a corner portion than at the central portion of the substrate W. Therefore, the dried corner portion may be melted by the solvent evaporated from the central portion.

In the reduced-pressure drying apparatus 1, the drying time is advantageously uniform across the substrate W due to the use of the solvent collecting net 31.

Figure 5A:
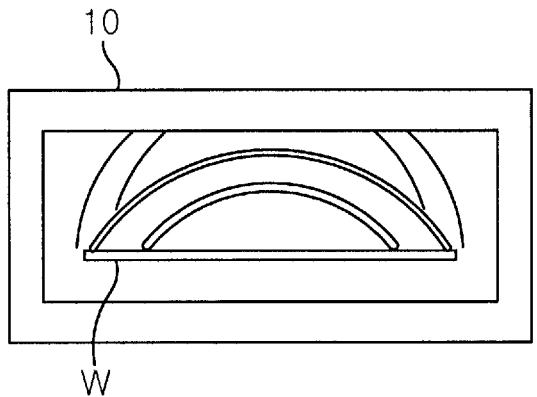
FIGS. 5A and 5B show states in a chamber of the exemplary reduced-pressure drying apparatus.
Figure 5B:
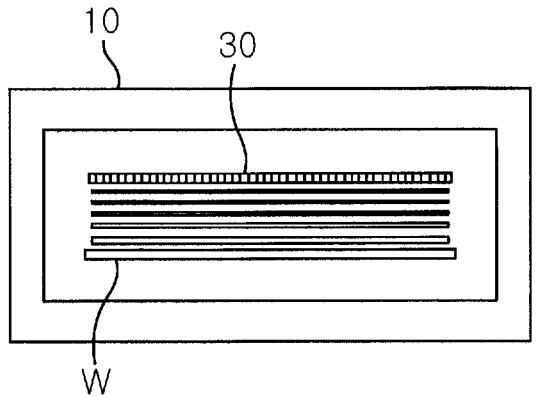

The mechanism for enhancing the drying time uniformity of the substrate W in the reduced-pressure drying apparatus 1 is described with reference to FIGS. 5A and 5B. FIGS. 5A and 5B show conditions in the chamber 10 of the reduced-pressure drying apparatus 1. FIG. 5A shows the case in which the solvent collecting net 31 is not provided and FIG. 5B shows the case in which the solvent collecting net 31 is provided. Gray lines in the chamber 10 in FIGS. 5A and 5B are isoconcentration lines. Thicker lines indicate higher concentration. In the following description, it is assumed that the evaporation speed is the same at the same concentration level regardless of the location in the substrate W and the temperature of the solvent collecting net 31 is constant regardless of the location in the solvent collecting net 31.

According to Fick's first law, the diffusion flux is proportional to the concentration gradient.

When the solvent collecting net 31 is not provided, the concentration gradient in the vertical direction is not uniform in the upper surface of the substrate W. Therefore, the diffusion flux on the substrate W becomes non-uniform in the surface of the substrate W. Accordingly, as shown in FIG. 5A, the concentration of the gaseous solvent above the substrate W becomes non-uniform and the drying time has variation in the same substrate W.

On the other hand, when the solvent collecting net 31 is provided to directly face the substrate W, the concentration gradient in the vertical direction becomes uniform in the upper surface of the substrate W in the chamber 10. Therefore, the diffusion flux on the substrate W becomes uniform in the surface of the substrate W. Accordingly, as shown in FIG. 5B, the concentration of the solvent above the substrate W becomes uniform and the drying time becomes uniform in the same substrate W.

Next, the solvent collecting net 31 of the solvent collecting unit 30 is described.

In the above description, the thermal capacity per unit area of the solvent collecting net 31 is, e.g., 372 J/K·m². However, the thermal capacity per unit area of the solvent collecting net 31 is not limited thereto and may be within a range from 106 J/K·m² to 850 J/K·m². This is because the temperature of the solvent collecting net 31 is decreased by adiabatic expansion in the chamber 10 due to the exhaust operation and increased by the radiant heat from the chamber 10 or the like. The thermal capacity per unit area of the solvent collecting net 31 having a plate thickness of 0.05 mm and an opening ratio of 80% is 106 J/K·m². The thermal capacity per unit area of the solvent collecting net 31 having a plate thickness of 0.2 mm and an opening ratio of 60% is 850 J/K·m².

The solvent collecting net 31 is supported between the substrate W and the top plate 12 as described above. More specifically, the solvent collecting net 31 is supported at a position where a distance between the top surface of the substrate W and the center in a thickness direction of the solvent collecting net 31 is 40% to 60% of a distance between the top surface of the substrate W and the bottom surface of the top plate 12 of the chamber 10. An expansion coefficient of the gas during the exhaust operation, e.g., an intensity of cooling by adiabatic expansion, which varies depending on a position in the vertical direction, is greater at a position in the above range than at the other positions. Therefore, the solvent collecting net 31 can be cooled efficiently by supporting the solvent collecting net 31 at that position. Since the heating by radiant heat from the chamber 10 to the solvent collecting net 31 in the vacuum state is not affected by the distance therebetween, the solvent can be quickly removed from the substrate W.

Figure 6A:
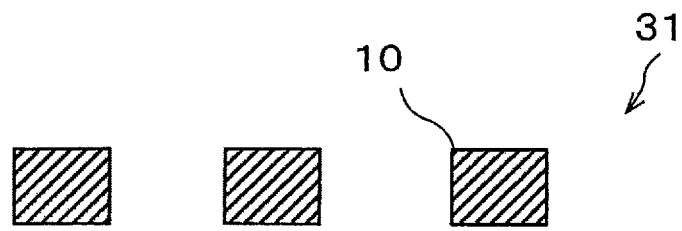
FIGS. 6A to 6C are cross sectional views and illustrate an exemplary manufacturing method for a net-shaped plate forming a solvent collecting net.
Figure 6B:
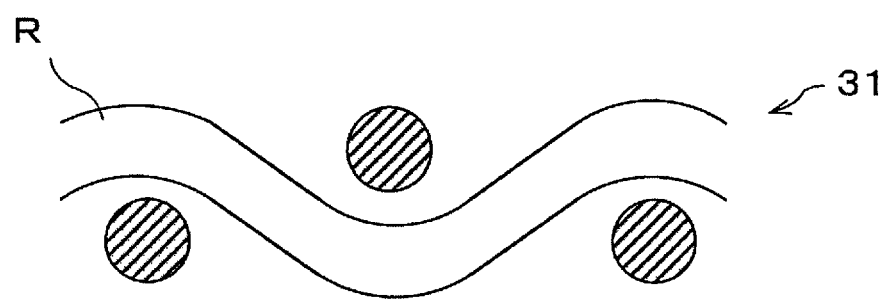
Figure 6C:
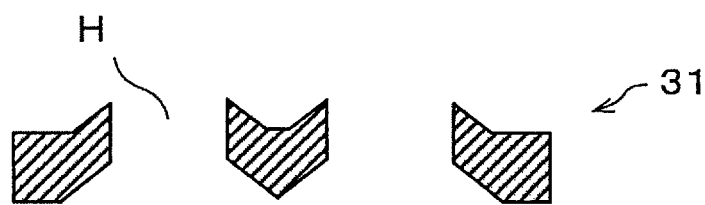

FIGS. 6A to 6C are cross sectional views illustrating an exemplary manufacturing method for the net-shaped plate forming the solvent collecting net 31.

The net-shaped solvent collecting net 31 is an expanded metal processed by slitting and expanding as described above. Therefore, as shown in FIG. 6A, the solvent collecting net 31 is formed in a quadrangular shape having a flat top surface and a flat bottom surface in a vertical cross section.

FIG. 6B shows a net-shaped solvent collecting net 31 formed by weaving wires R. The wires R have a cylindrical cross section. A portion where the wires R are overlapped by the weaving is shaded. Therefore, in the case of weaving the wires R, it is difficult to obtain radiant heat uniformly from top and bottom, which makes it difficult to increase the temperature of the solvent collecting net 31. Accordingly, a long period of time is needed to remove the solvent from the solvent collecting net 31. Further, in the case of weaving the wires R, particles are likely to be generated because of rubbing at contact portions between the wires R.

FIG. 6C shows a solvent collecting net 31 formed in a net shape by forming openings H by punching a flat plate. The top surface and the bottom surface are not flat in the vertical cross section, as shown. Therefore, it is difficult for the solvent collecting net 31 to obtain the radiant heat from the top plate of the chamber 10 and a long period of time is required to remove the solvent from the solvent collecting net 31. If the solvent collecting net 31 is manufactured by punching, pointed portions are formed and, thus, dust or other particles can easily adhere thereto. Further, if the openings H are formed by punching, it is difficult to increase an opening ratio. Accordingly, the air stream generated by vacuum suction cannot efficiently diffuse and pass through the solvent collecting unit 31 during the cooling, even if the solvent collecting net 31 is cooled.

However, if the solvent collecting net 31 is an expanded metal, the solvent collecting net 31 is formed in a quadrangle shape having a flat top surface and a flat bottom surface in a vertical cross section as described above. Therefore, the solvent collecting net 31 that is an expanded metal easily receives the radiant heat from the top plate of the chamber 10. Accordingly, the adsorbed solvent can be removed within a short period of time. Further, if the solvent collecting net 31 is an expanded metal, pointed portions are not formed and, thus, dust or other particles do not intend to adhere. In addition, since the rubbing that occurs due to wire weaving is avoided, particles would not be generated. In the case of using an expanded metal, the opening ratio can be increased, so that the solvent can be collected with high efficiency during the cooling.

The solvent collecting net 31 is not limited to an expanded metal manufactured by slitting and expanding and may also be manufactured by forming slits in a flat plate and expanding the flat plate or other suitable processes.

In the above description, the thickness of the solvent collecting net 31 is about 0.1 mm. However, the thickness of the solvent collecting net 31 may be greater than or equal to 0.05 mm and smaller than or equal to 0.2 mm. If the thickness of the solvent collecting net 31 is 0.05 mm or above, the solvent collecting net 31 can be easily manufactured. If the thickness of the solvent collecting net 31 is 0.2 mm or less, the thermal capacity per unit area is reduced and, thus, the adsorption rate of the solvent can be increased.

In the above description, the opening ratio of the solvent collecting net 31 is about 65%. However, it is preferable that the opening ratio of the solvent collecting net 31 is greater than or equal to 60% and smaller than or equal to 80%. If the opening ratio is greater than or equal to 60%, the collection efficiency of the solvent in the solvent collecting net 31 can be increased. If the opening ratio is smaller than or equal to 80%, the solvent collecting net 31 can be easily manufactured.

Second Embodiment

Figure 7:
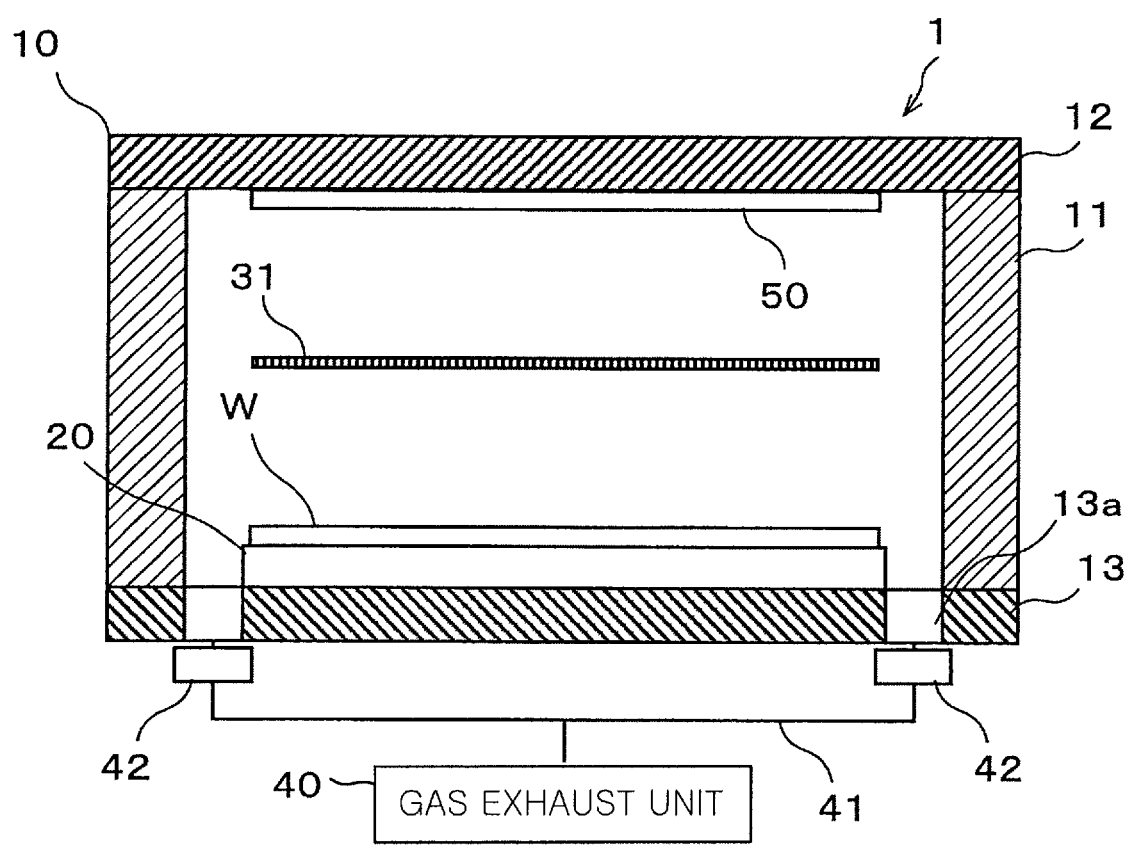
FIG. 7 is a vertical cross sectional view showing a configuration of an exemplary reduced-pressure drying apparatus according to a second embodiment.

FIG. 7 is a vertical cross sectional view showing a configuration of an exemplary reduced-pressure drying apparatus according to a second embodiment.

The reduced-pressure drying apparatus 1 shown in FIG. 7 includes an infrared ray emitter 50.

The infrared ray emitter 50 is a plate-shaped member provided at a bottom surface side of the top plate 12 of the chamber 10 and directly faces the solvent collecting net 31. The infrared ray emitter 50 emits infrared rays to heat the solvent collecting net 31 having a temperature lower than that of the infrared ray emitter 50.

By providing the infrared ray emitter 50, the solvent on the solvent collecting net 31 can be quickly removed.

The infrared ray emitter 50 has therein a heater. When the solvent needs to be evaporated from the substrate, the heater is switched OFF to prevent the solvent collecting net 31 from being heated by the infrared ray emitter 50. It is simpler to provide the heater at the infrared ray emitter 50 than at the solvent collecting net 31. In the case of providing the heater at the solvent collecting net 31, the thermal capacity of the solvent collecting unit 30 is increased, which makes it difficult to cool the solvent collecting unit 31 by the exhaust operation.

The infrared ray emitter 50 may be a cylindrical member or the like. To make the infrared ray emitter 50 function as a black body, a blackening process may be used in making the infrared ray emitter 50. The blackening process, e.g., a process of coating a black paint, includes a process of forming the infrared ray emitter 50 by using a black material. By using the black material, the radiant heat can be large without a heater, so that the effect of heating the solvent collecting net 31 is improved.

Third Embodiment

Figure 8A:
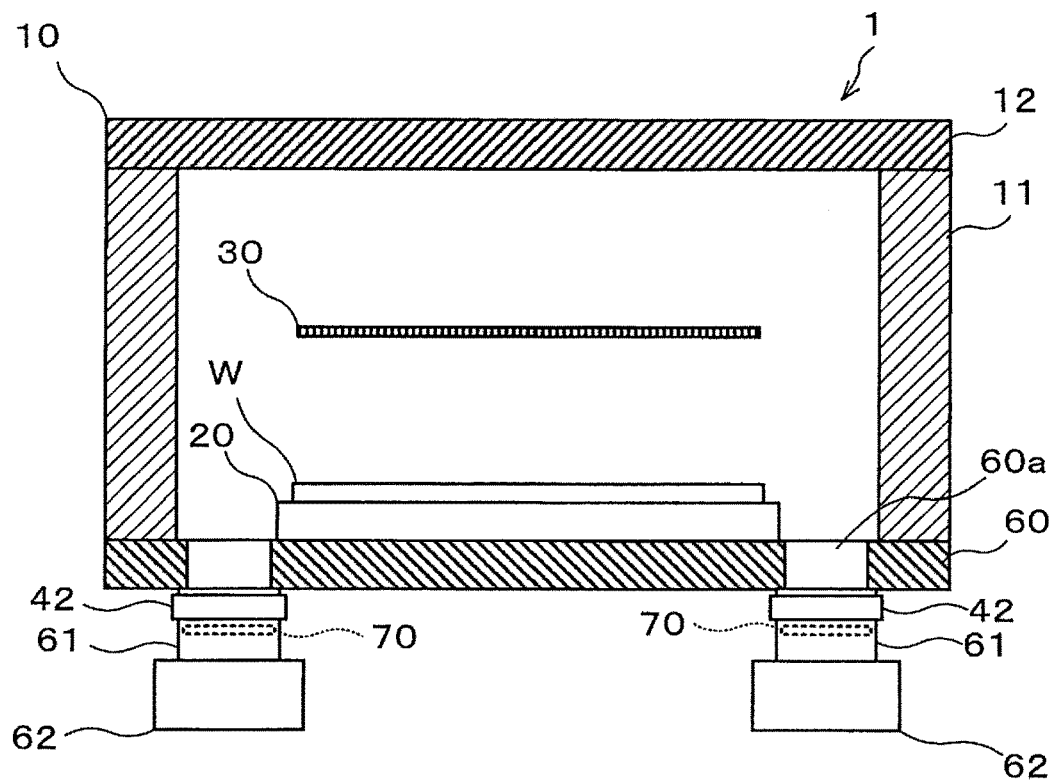
FIGS. 8A and 8B show a configuration of an exemplary reduced-pressure drying apparatus according to a third embodiment.
Figure 8B:
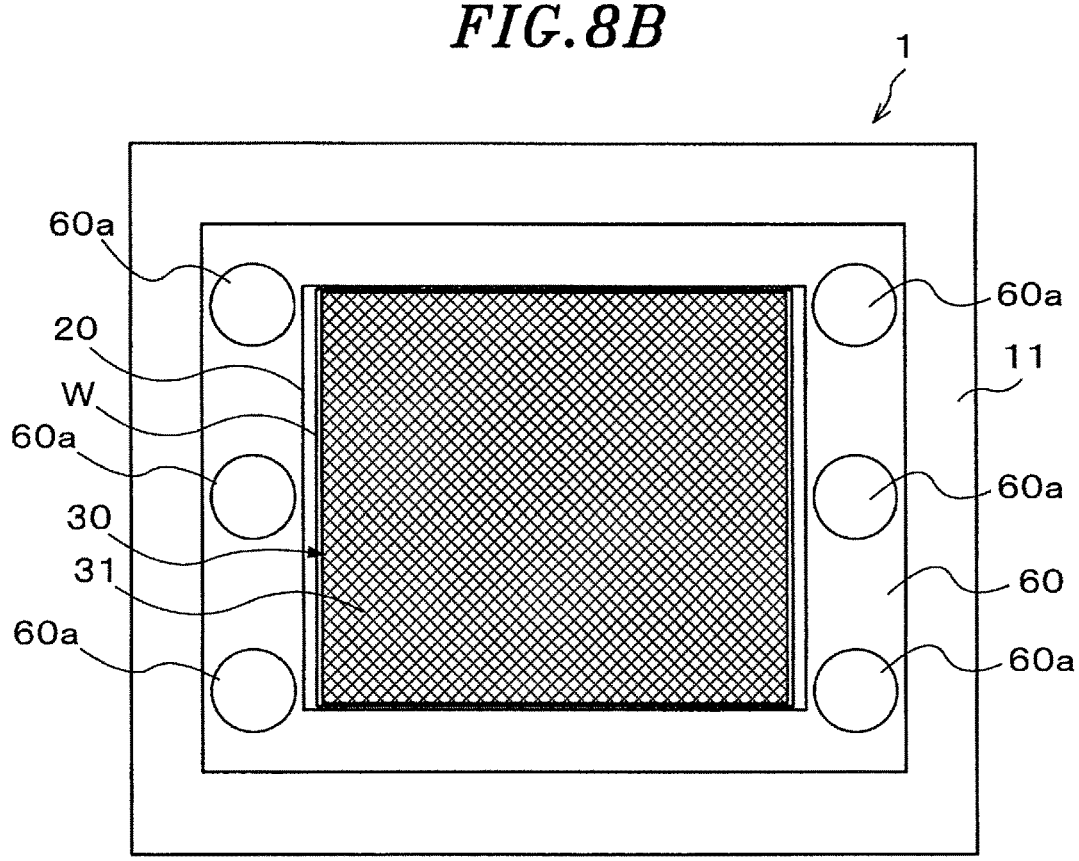

FIGS. 8A and 8B show a configuration of an exemplary reduced-pressure drying apparatus according to a third embodiment. FIG. 8A is a cross sectional view showing a configuration of the exemplary reduced-pressure drying apparatus, and FIG. 8B is a top view showing a configuration inside the exemplary reduced-pressure drying apparatus. In FIG. 8A, a structure for supporting the solvent collecting unit 30 is not illustrated. In FIG. 8B, the top plate 12 and the like is not illustrated.

A bottom plate 60 of the reduced-pressure drying apparatus 1 shown in FIGS. 8A and 8B blocks a lower opening of the main body 11. A mounting table 20 is disposed on the bottom plate 60. In the bottom plate 60, a plurality of openings 60a is formed at an outer periphery of the mounting table 20. In this example, three openings 60a are formed along one side of the mounting table 20 and three openings 60a are provided along a side opposite to the one side.

The openings 60a are coupled to gas exhaust units 62 through respective gas exhaust lines 61. The inside of the chamber 10 of the reduced-pressure drying apparatus 1 can be depressurized through the openings 60a.

Each of the gas exhaust units 62 includes a vacuum pump. More specifically, a turbo molecular pump and a dry pump are coupled in series in that order from an upstream side, for example. The gas exhaust unit 62 is provided for each of the openings 60a.

An APC valve 42 is provided in the gas exhaust line 61.

The reduced-pressure drying apparatus 1 of the present embodiment includes another solvent collecting unit 70 for drying the solvent collecting unit 30. This solvent collecting unit 70 can temporarily collect the solvent that has been temporarily collected in the solvent collecting unit 30 and vaporized, and then can dry the solvent in the chamber 10. Hereinafter, this solvent collecting unit 70 may be referred to as a seasoning collecting unit 70 and the solvent collecting unit 30 may be referred to as a substrate drying collecting unit 30. The seasoning collecting unit 70 is maintained at a temperature lower than that of the substrate drying collecting unit 30 after the evaporation of the solvent in the solution on the substrate W is completed. Accordingly, when the solvent temporarily collected in the substrate drying collecting unit 30 is vaporized, the vaporized solvent can be temporarily collected by the seasoning collecting unit 70. The seasoning collecting unit 70 is different from the substrate drying collecting unit 30 in a dimension and/or in a shape. However, the seasoning collecting unit 70 may be made of the same material as that of the substrate drying collecting unit 30. For example, as in the case of the substrate drying collecting unit 30, the seasoning collecting unit 70 has a solvent collecting net (not shown) that is a net-shaped plate.

The seasoning collecting unit 70 is provided in a space between the substrate drying collecting unit 30 and each of the gas exhaust units 62. More, specifically, the seasoning collecting unit 70 is provided at a downstream side of the APC valve 42 as a shield member for opening/closing a gap between a space where the substrate drying collecting unit 30 is provided and a space where the gas exhaust unit 62 is provided. More specifically, the seasoning collecting unit 70 is provided at the downstream side of the APC valve 42 in the gas exhaust line 61.

Next, a reduced-pressure drying process using the reduced-pressure drying apparatus 1 of the present embodiment is described below.

The steps up to the drying of the substrate W in the reduced-pressure drying process using the reduced-pressure drying apparatus 1 of the present embodiment are the same as those in the reduced-pressure drying process using the reduced-pressure drying apparatus of the first embodiment. Therefore, the description thereof will be omitted.

In the reduced-pressure drying process using the reduced-pressure drying apparatus 1 of the present embodiment, as in the first embodiment, a gas in the chamber 10 is adiabatically expanded and cooled by exhausting the chamber 10 during the drying of the substrate W. The temperature of the substrate drying collecting unit 30 and the temperature of the seasoning collecting unit 70 are decreased by the cooled gas in the chamber 10. At this time, the seasoning collecting unit 70 has a temperature lower than that of the substrate drying collecting unit 30 because a flow rate of the cooled gas per unit area near the seasoning collecting unit 70 is greater than that near the substrate drying collecting unit 30.

Although the temperature of the seasoning collecting unit 70 is lower than that of the substrate drying collecting unit 30, the solvent vaporized from the substrate W is collected by the substrate drying collecting unit 30 because the seasoning collecting unit 70 is further from the substrate W than the substrate drying collecting unit 30.

Even after the removal of the solvent on the substrate W is completed by continuously performing the operation of collecting the solvent vaporized from the substrate W in the substrate drying collecting unit, the gas exhaust operation in the turbo molecular pump of the gas exhaust unit 62 continues. This can facilitate removal of the solvent collected by the substrate drying collecting unit 30 from the substrate drying collecting unit 30 and dry the substrate drying collecting unit 30. During the drying operation, the solvent vaporized from the substrate drying collecting unit 30 is collected by the seasoning collecting unit 70 because the temperature of the seasoning collecting unit 70 is lower than that of the substrate drying collecting unit 30. Therefore, the concentration of the gaseous solvent near the substrate drying collecting unit 30 is maintained at a low level. Accordingly, it is possible to quickly remove the solvent on the substrate drying collecting unit 30 and dry the substrate drying collecting unit 30.

If the gas exhaust operation in the turbo molecular pump continues even after the completion of the removal of the solvent on the substrate W as described above, the temperature of the substrate drying collecting unit 30 is increased by the radiant heat from the top plate 12 of the chamber 10, the substrate W or the like as described in the first embodiment. However, the increase in the temperature of the seasoning collecting unit 70 by the radiant heat is slow because the seasoning collecting unit 70 is located further from the top plate 12, the substrate W or the like compared to the substrate drying collecting unit 30. Therefore, the temperature difference between the seasoning collecting unit 70 and the substrate drying collecting unit 30 is increased. Accordingly, the solvent can be quickly removed or separated from the substrate drying collecting unit 30.

The drying process of the substrate drying collecting unit 30 in which the solvent is removed from the substrate drying collecting unit 30 may end after the gas exhaust operation using the turbo molecular pump of the gas exhaust unit 62 is performed for a predetermined period of time.

Upon completion of the drying process of the substrate drying collecting unit 30, the APC valve 42 is closed. Accordingly, the space in the chamber 10 where the substrate W is provided and the space where the seasoning collecting unit 70 is provided can be separated from each other.

The inside of the chamber 10 is air-purged, a process of loading/unloading the substrate W and a process of drying the seasoning collecting unit 70 are performed at the same time. By performing both processes at the same time, the time required for the entire reduced-pressure drying process using the reduced-pressure drying apparatus 1 of the present embodiment can be shortened considerably.

The seasoning collecting unit 70 is provided in the gas exhaust line 61 and heated by the radiant heat from the turbo molecular pump of the gas exhaust unit 62. Therefore, the vaporization of the solvent from the seasoning collecting unit 70 can be expedited, which makes it possible to shorten the time required until the seasoning collecting unit 70 is dried. Accordingly, the seasoning collecting unit 70 can be dried until the loading/unloading process is completed. Since the radiant heat from the turbo molecular pump of the gas exhaust unit 62 is used, a separate unit for heating the seasoning collecting unit 70 is not required. This can advantageously simplify the configuration of the the reduced-pressure drying apparatus 1 and thereby reduce the manufacturing and operational cost.

Fourth Embodiment

Figure 9:
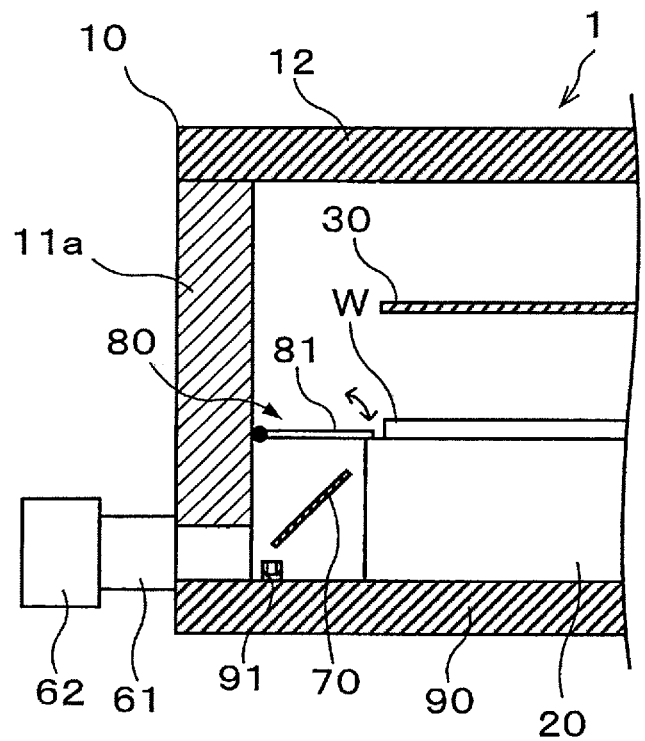
FIG. 9 shows a configuration of an exemplary reduced-pressure drying apparatus according to a fourth embodiment.

FIG. 9 shows a configuration of an exemplary reduced-pressure drying apparatus according to a fourth embodiment. In FIG. 9, a partial cross section of the reduced-pressure drying apparatus is illustrated.

In the above example, the APC valve 42 is used as the shield member of the present disclosure. However, in case that it is not required to control the pressure in the chamber 10 of the reduced-pressure drying apparatus 1 with high accuracy, a different member may be used as the shield member.

In the reduced-pressure drying apparatus 1 shown in FIG. 9, a shield member 80 having a shutter 81 for opening/closing a gap between the mounting table 20 and a sidewall 11a of the chamber 10, e.g., in a hinge manner is provided, as the shield member, in the chamber 10. By using the shield member 80, the reduced-pressure drying apparatus 1 can be manufactured at a low cost compared to the case of using the APC valve 42.

In the third embodiment, the APC valve 42 serving as the shield member is provided in the gas exhaust line 61. However, in the present embodiment, the shield member 80 is provided in the chamber 10. Therefore, the seasoning collecting unit 70 to be provided at a downstream side of the shield member can be provided inside the chamber 10. In other words, the position of the seasoning collecting unit 70 can be closer to the substrate drying collecting unit 30 compared to that in the third embodiment. With the seasoning collecting unit 70 provided near the substrate drying collecting unit 30, the solvent vaporized from the substrate drying collecting unit 30 can be efficiently collected by the seasoning collecting unit 70.

In the third embodiment, the seasoning collecting unit 70 is disposed such that the surface thereof becomes horizontal. However, in the present embodiment, the surface of the seasoning collecting unit 70 is inclined non-horizontally and non-vertically. A receiving part 91 is provided on the bottom plate 90 and below the lowermost portion of the seasoning collecting unit 70. The receiving part 91 receives a liquid solvent collected by the seasoning collecting unit 70. The liquid solvent moves along the inclined surface of the seasoning collecting unit 70 and falls from the seasoning collecting unit 70 to the receiving part 91.

The liquid solvent received by the receiving part 91 is vaporized and discharged to the outside of the chamber 10 by the gas exhaust unit 62. In such configuration, the receiving part 91 may be heated by a heating mechanism for heating the receiving part 91. Therefore, the vaporization of the liquid solution received by the receiving part 91 can be promoted. As a consequence, the solvent in the chamber 10 can be quickly discharged to the outside of the chamber 10.

Fifth Embodiment

Figure 10:
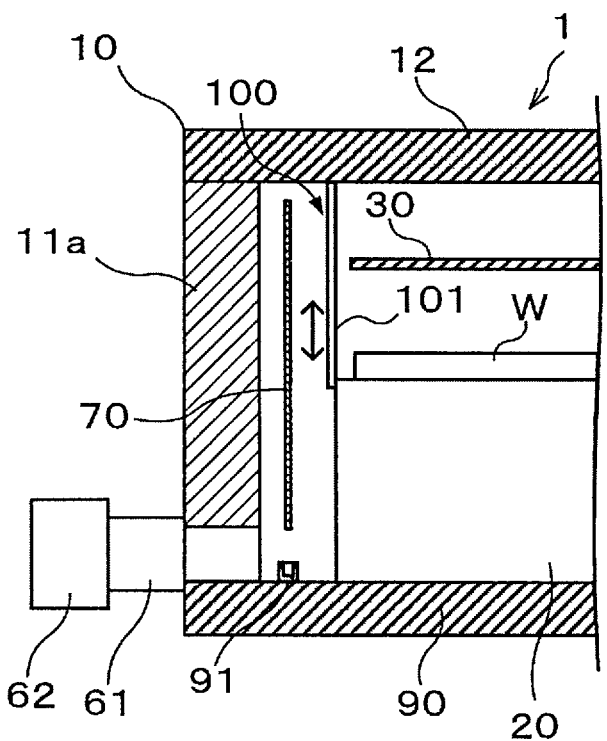
FIG. 10 shows a configuration of an exemplary reduced-pressure drying apparatus according to a fifth embodiment.

FIG. 10 shows a configuration of an exemplary reduced-pressure drying apparatus according to a fifth embodiment. In FIG. 10, a partial cross section of the reduced-pressure drying apparatus is illustrated.

In the reduced-pressure drying apparatus shown in FIG. 10, a shield member 100 having a shutter 101 for opening/closing a gap between the mounting table 20 and the top plate 12 of the chamber 10 is provided, as the shield member, in the chamber 10. By moving the shutter 101 in a vertical direction, i.e., up and down, the gap between the mounting table 20 and the top plate 12 can be opened/closed. By using the shield member 100, the same effect as that in the fourth embodiment can be obtained and the following effects can also be obtained.

In other words, in the configuration using the shield member 100, at least part of the seasoning collecting unit 70 can be positioned above the top surface of the mounting table 20. Therefore, the distance between the seasoning collecting unit 70 and the substrate drying collecting unit 30 becomes short. Accordingly, the solvent vaporized from the substrate drying collecting unit 30 can be efficiently collected by the seasoning collecting unit 70.

In the present embodiment, the seasoning collecting unit 70 may extend in the vertical direction. Therefore, in the present embodiment, the distance between the sidewall 11a of the chamber 10 and the mounting table 20 can be reduced compared to that in the fourth embodiment. In other words, the scaling up of the chamber 10 dimensions can be avoided.

In the fourth and the fifth embodiment, the seasoning collecting unit 70 is disposed to be heated by the radiant heat from the turbo molecular pump of the gas exhaust unit 62.

In the examples shown in FIGS. 9 and 10, the gas exhaust line 61 coupled to the gas exhaust unit 62 is provided at the sidewall 11a of the chamber 10. However, the gas exhaust line 61 may be provided at the bottom plate 90. By providing the gas exhaust unit 62 at the sidewall 11a, even if liquid droplets of a large amount of solvent collected in the seasoning collecting unit 70 fall downward, the liquid droplets would not enter the gas exhaust unit 62. Accordingly, the gas exhaust unit 62 can be protected from potential damages caused by the liquid droplets.

The heating mechanism for heating the receiving part 91 can be simply provided compared to the case of providing the same heating mechanism at the substrate drying collecting unit 30.

The opening/closing of the shutters 81 and 101 in the fourth and the fifth embodiment are controlled by the control unit of the reduced-pressure drying apparatus 1.

The reduced-pressure drying process using the reduced-pressure drying apparatus 1 of the fourth and the fifth embodiment is substantially the same as the reduced-pressure drying process of the third embodiment. Therefore, the description thereof will be omitted.

In the above description, the drying process of the seasoning collecting unit 70 and the loading/unloading process for the substrate W can be performed at the same time. However, the loading/unloading process of the substrate W may be performed after the drying process of the seasoning collecting unit 70 is completed. In that case, it is not required to provide the seasoning collecting unit 70 at the downstream side of the shield member such as the APC valve 42 or the like and the seasoning collecting unit 70 may be provided at an upstream side of the shield member. In the case that the seasoning collecting unit 70 is provided at the upstream side, the shield member and the seasoning collecting unit 70 can be provided near the turbo molecular pump of the gas exhaust unit 62 and the seasoning collecting unit 70 can be heated by the radiant heat from the turbo molecular pump. As a result, the solvent collected by the seasoning collecting unit 70 can advantageously be quickly vaporized and removed.

To quickly collect the solvent in the seasoning collecting unit 70 and quickly vaporize and remove the solvent collected in the seasoning collecting unit 70, a cooling mechanism or a heating mechanism may be provided at the seasoning collecting unit 70 while preventing the reduced-pressure drying apparatus 1 from being complicated in configuration.

First Reference Embodiment

Figure 11:
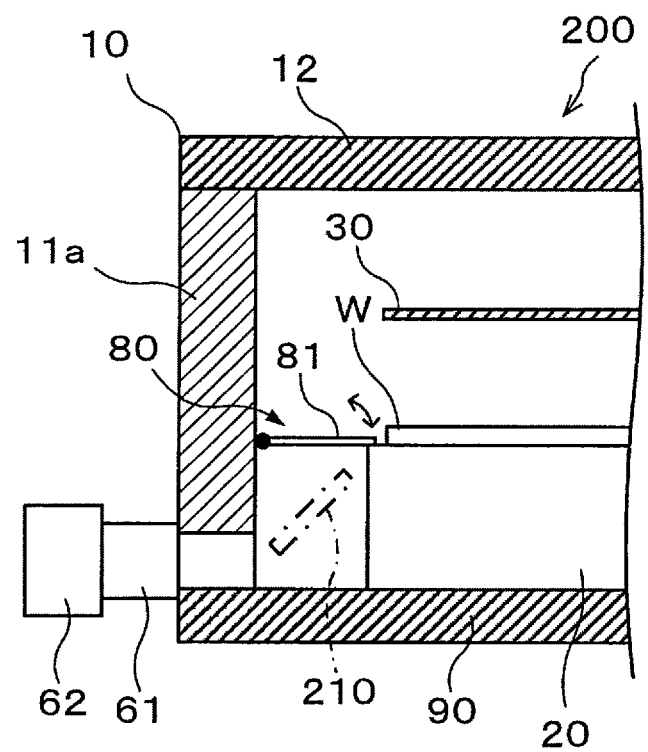
FIG. 11 is a vertical cross sectional view showing a configuration of an exemplary reduced-pressure drying apparatus according to a first reference embodiment.

FIG. 11 is a vertical cross sectional view showing a configuration of an exemplary reduced-pressure drying apparatus according to a first reference embodiment. In FIG. 11, only a position where the seasoning collecting unit is provided is illustrated.

In the third to the fifth embodiment, basically, the seasoning collecting unit 70 does not have a cooling/heating mechanism for cooling and/or heating the seasoning collecting unit 70. However, in a reduced-pressure drying apparatus 200 according to the first reference embodiment shown in FIG. 11, a drying collecting unit 210 has a cooling/heating mechanism for cooling/heating the seasoning collecting unit 210.

FIGS. 12A to 12D are vertical cross sectional views illustrating the seasoning collecting unit 210 having various exemplary cooling/heating mechanisms.

Figure 12A:
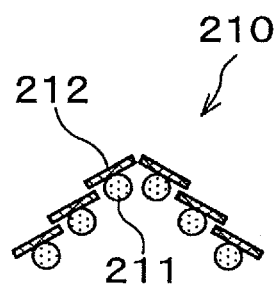
FIGS. 12A to 12D illustrate examples of a seasoning collecting unit having a cooling/heating mechanism.

The cooling/heating mechanism of the seasoning collecting unit 210 shown in FIG. 12A has a plurality of coolant lines 211 through which a cooled coolant and a heated coolant can flow alternately. The coolant lines 211 are made of a material having high thermal conductivity, e.g., copper. The coolant lines 211 are arranged in an inversed "V" shape in which a central portion is high when seen from a side. A metallic plate 212 for collecting a solvent is fixed by welding or the like to an upper portion of each of the coolant lines 211. The plates 212 are overlapped partially and inclined non-horizontally in a fixed state so that the liquid solvent collected by the plate 212 can flow outward along the plates 212. In this structure, although it is not illustrated, it is preferable to use a single receiving part (see the reference numeral 91 in FIG. 9) having a heating mechanism at an outer side of the seasoning collecting unit 210.

Figure 12B:
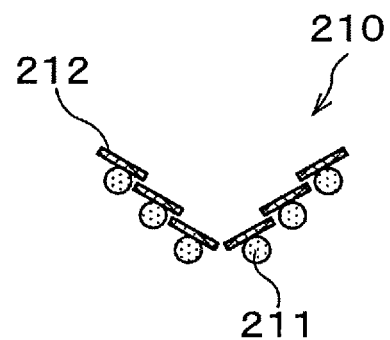

In the cooling/heating mechanism of the seasoning collecting unit 210 shown in FIG. 12B, the coolant lines 211 are arranged in a V-shape in which a central portion is low when seen from a side. The plates 212 fixed to the upper portions of the coolant lines 211 are overlapped partially and inclined non-horizontally in a fixed state so that the liquid solvent collected by the plate 212 can flow inward along the plates 212. In this structure, although it is not illustrated, it is preferable to use a single receiving part (see the reference numeral 91 in FIG. 9) having a heating mechanism at the center of the seasoning collecting unit 210.

Figure 12C:
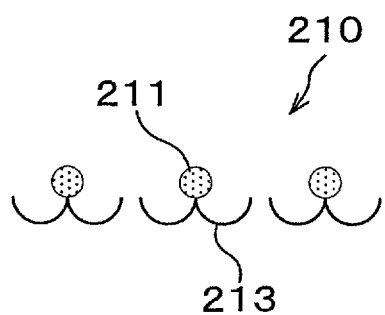

In the cooling/heating mechanism of the seasoning collecting unit 210 shown in FIG. 12C, the coolant lines 211 are arranged in parallel when seen from a side. In this configuration, the solvent is collected and liquefied by the coolant lines 211. Further, in this configuration, a W-shaped receiving part 213 is coupled to (e.g., fixed to) a lower portion of each of the coolant lines 211 by welding or the like to receive the solvent that has been collected and liquefied by the coolant line 211.

Figure 12D:
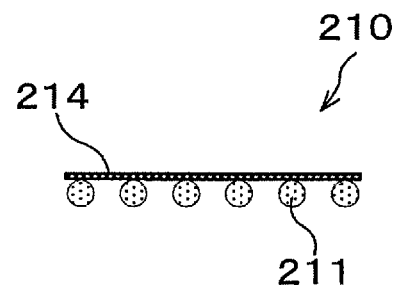

In a cooling/heating mechanism of the seasoning collecting unit 210 shown in FIG. 12D, the coolant lines 211 are arranged in parallel when seen from a side. A metallic net-shaped member 214 is coupled to (e.g., fixed to) the coolant lines 211 by welding or the like. The solvent is collected by the net-shaped member 214 or the like.

Second Reference Embodiment

Figure 13:
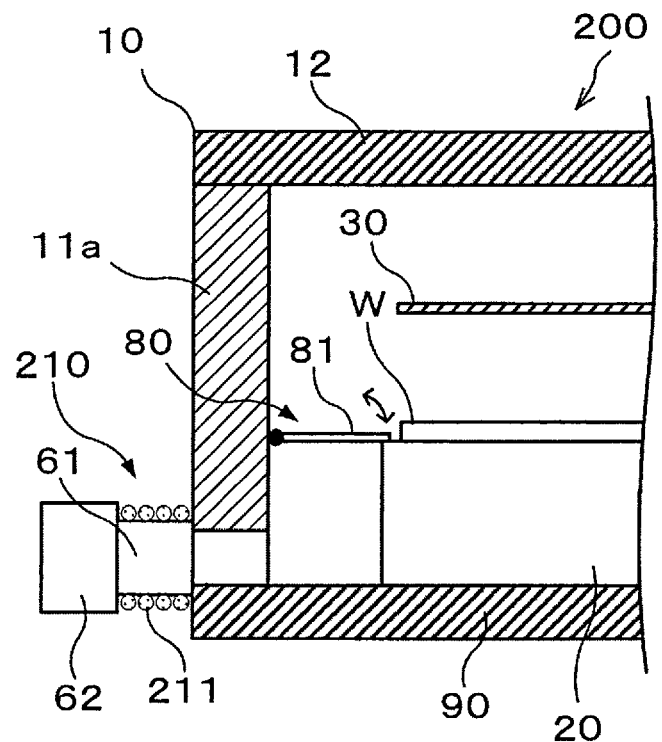
FIG. 13 is a vertical cross sectional view showing a configuration of an exemplary reduced-pressure drying apparatus according to a second reference embodiment.

FIG. 13 is a vertical cross sectional view showing a configuration of an exemplary reduced-pressure drying apparatus according to a second reference embodiment.

In a reduced-pressure drying apparatus 200 shown in FIG. 13, a coolant line 211 as a cooling/heating mechanism is wound around a gas exhaust line 61. The gas exhaust line 61 serves as the seasoning collecting unit 210.

In the first and the second reference embodiments, the seasoning collecting unit has the cooling/heating mechanism and, thus, it is possible to quickly dry the substrate drying collecting unit and the seasoning collecting unit. Accordingly, the concentration of the solvent in the chamber can be quickly decreased to a desired level.

In the above example, the cooled coolant and the heated coolant can flow alternately. However, only one of the cooled coolant and the heated coolant may flow. In addition, the cooling/heating mechanism may have a configuration in which a coolant line through which the cooled coolant flows and a heating line through which the heated coolant flows are alternately arranged.

Third Reference Embodiment

Figure 14:
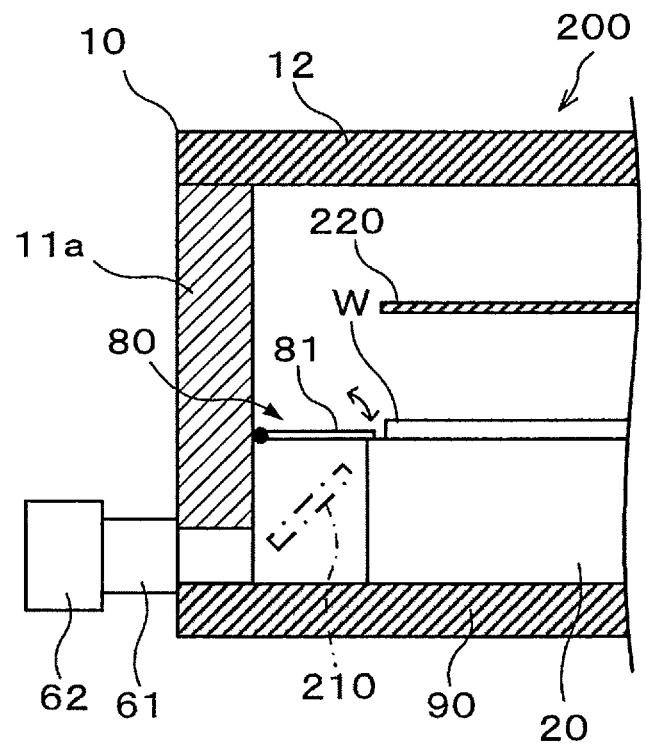
FIG. 14 is a vertical cross sectional view showing a configuration of an exemplary reduced-pressure drying apparatus according to a third reference embodiment.

FIG. 14 is a vertical cross sectional view showing a configuration of an exemplary reduced-pressure drying apparatus according to a third reference embodiment.

A reduced-pressure drying apparatus 200 shown in FIG. 14 includes a drying collecting unit 210 having a cooling/heating mechanism, and a substrate drying collecting unit 220 having a cooling/heating mechanism. As for the cooling/heating mechanism of the substrate drying collecting unit 220, a conventional one may be employed. In this reduced-pressure drying apparatus 200 as well, time required for the reduced-pressure drying process can be reduced considerably.

In the above description, the gas exhaust unit has the turbo molecular pump. However, the gas exhaust unit may have only a dry pump if the adsorption performance of the seasoning collecting unit is comparable to the exhaust performance of the turbo molecular pump. In the case of employing this configuration as well, the time required for drying the substrate is the same as that in the case of employing the configuration having the turbo molecular pump. When the gas exhaust unit has only the dry pump, it is preferable to heat the substrate W by the mounting unit 20 during the drying process of the substrate W or heat the seasoning collecting unit 70 provided at a downstream side of the shield member in a state where the shield member is closed after the substrate drying collecting unit 30 is dried.

Other Embodiments

The reduced-pressure drying apparatus according to the embodiments of the present disclosure preferably includes a temperature control unit for controlling a lowest temperature of the solvent collecting net during an exhaust operation by a technique other than cooling or heating. This is because the adsorption efficiency of the solvent on the solvent collecting net, i.e., the drying time of the substrate, or the time required until the solvent is removed from the solvent collecting net can be controlled by controlling the lowest temperature of the solvent collecting net during the exhaust operation.

The above-described temperature control unit controls the lowest temperature of the solvent collecting net by controlling the exhaust speed in the dry pump by controlling the opening degree of the APC valve (see the reference numeral 42 in FIG. 1), for example. However, the temperature control unit is not limited thereto. For example, the lowest temperature of the solvent collecting net may be controlled by controlling a vertical position of the substrate by using the elevation pins provided at the mounting table during the drying process of the substrate. This is because the intensity of cooling by adiabatic expansion during the exhaust operation varies depending on a position of the solvent collecting net between the top plate of the chamber and the substrate. In addition, the lowest temperature of the solvent collecting net may be controlled by controlling a vertical position of the solvent collecting net by using an additional mechanism for controlling a vertical position of the solvent collecting net.

TEST EXAMPLE

In a test example 1, a reduced-pressure drying apparatus having the same components as those of the reduced-pressure drying apparatus 1 of FIG. 1 performed a reduced-pressure drying process on a glass substrate of 2200 mm×2500 mm which is coated with solution by an inkjet method. In the test example 1, twelve expanded metals of 2200 mm×200 mm were arranged and used as the solvent collecting net 31 of the solvent collecting unit 30. The expanded metals are made of stainless steel (SUS316 BA) and have a net thickness of 0.1 mm, an opening ratio of 65%, and a unit mass of 0.61 kg/m$^2$.

In the test example 1, the solvent collecting net 31 was supported at an intermediate position between the substrate W and the top plate 12 of the chamber 10. A supporting structure used at that time includes leg parts provided at both ends of the top plate 12 of the chamber 10 and long supporting members (stays) provided in parallel at the leg parts. The expanded metals were fixed by screws to the supporting members.

In the test example 1, the exhaust operation was performed by the dry pump until the pressure in the chamber 10 became 10 Pa and, then, the exhaust operation was performed by the turbo molecular pump.

In a comparative example 1, the solvent collecting unit 30 was not provided. Other configurations except the configuration related to the solvent collecting unit 30 in the comparative example 1 are the same as those in the test example 1.

In a comparative example 2, a member for collecting a solvent is made of a punched metal. A horizontal dimension of the punching metal is equal to that in the test example. However, the punching metal has an opening ratio of 34% and a thickness of 0.2 mm. A volume of the solvent collecting member made of the punching metal is 3.6 on the assumption that a volume of the solvent collecting net 31 made of the expanded metal is set to 1. In other words, the thermal capacity of the member for collecting a solvent in the comparative example 2 was greater than that in the test example 1. Other configurations except the member for collecting a solvent in the comparative example 2 are the same as that in the test example 1.

In the comparative example 1, the drying time of the substrate was 103 seconds near the central portion of the substrate and 92 seconds at the corner portion of the substrate.

In the test example 1, the drying time of the substrate was 71 seconds near the central portion of the substrate and 67 seconds at the corner portion of the substrate. In other words, the drying time of the substrate in the test example 1 was shorter than that in the comparative example 1 and, also, the uniformity of the drying time in the same substrate was uniform compared to that in the comparative example 1. Further, in the test example 1, the lowest temperature at the central portion of the solvent collecting net 31 during the drying process was 8° C.

In the comparative example 2, the lowest temperature at the central portion of the solvent collecting member during the drying process was 18° C. which is lower than the room temperature. However, the drying time of the substrate and the drying uniformity were the same as those in the comparative example 1. In other words, adsorption effect of the solvent collecting member made of a punching metal was not observed.

Figure 15:
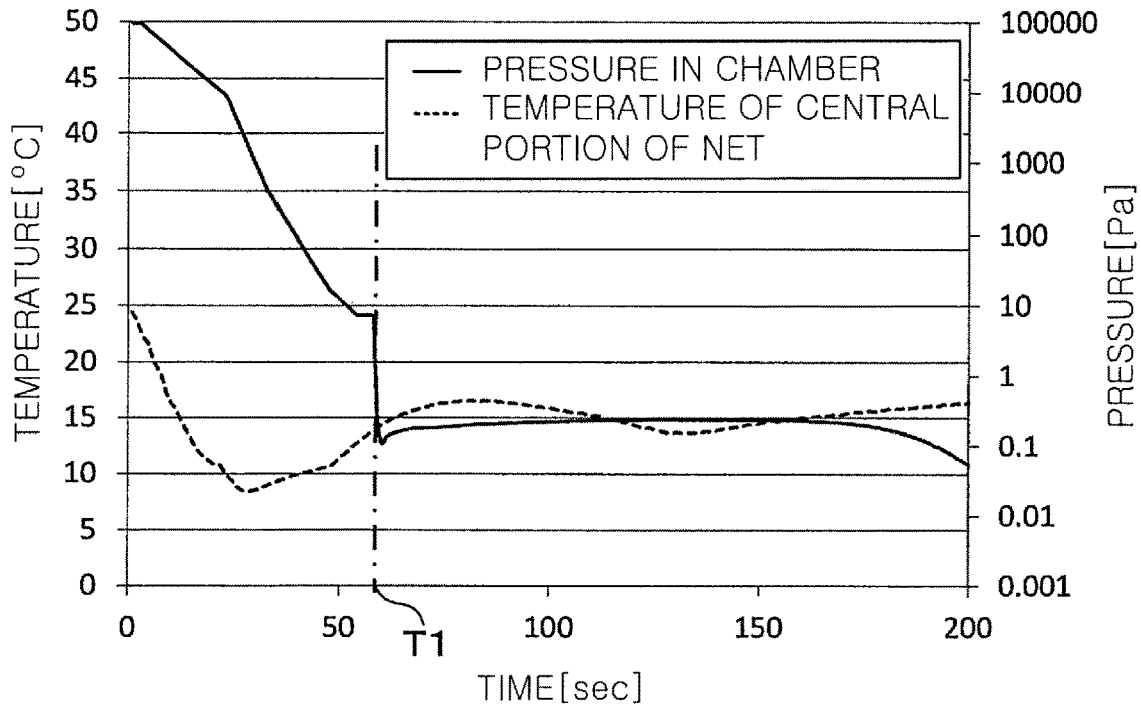
FIGS. 15 to 17 show example temporal changes of the pressure in a chamber and the temperature in a central portion of the solvent collecting net in a test example 1.
Figure 16:
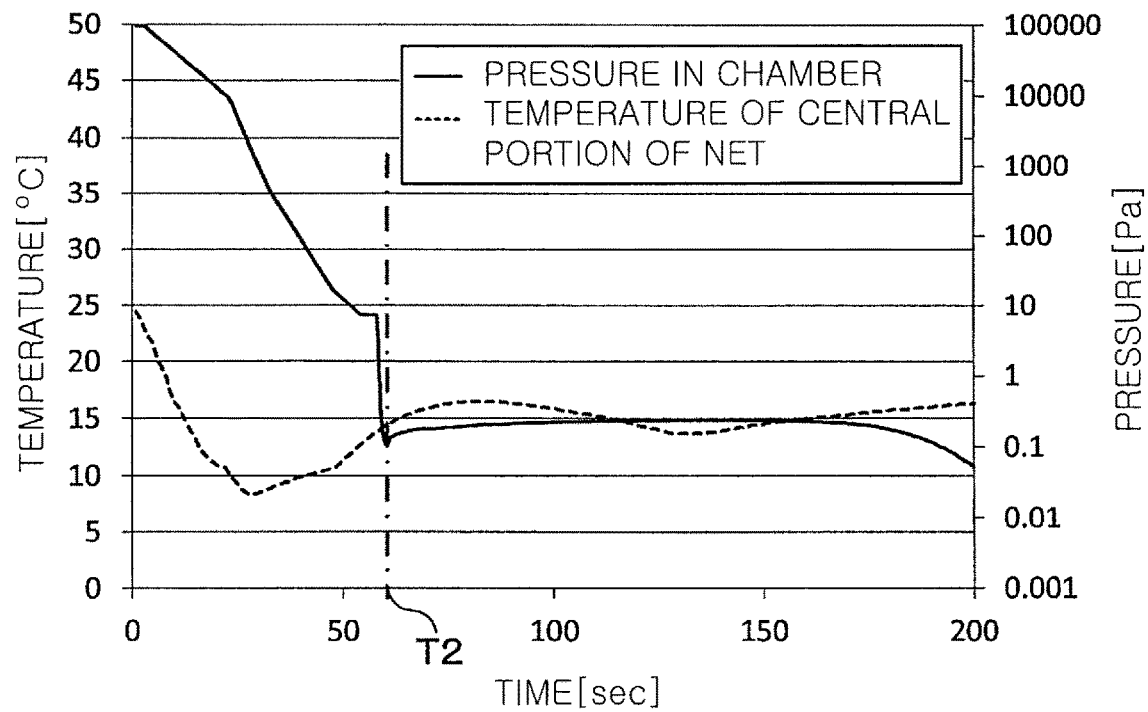
Figure 17:
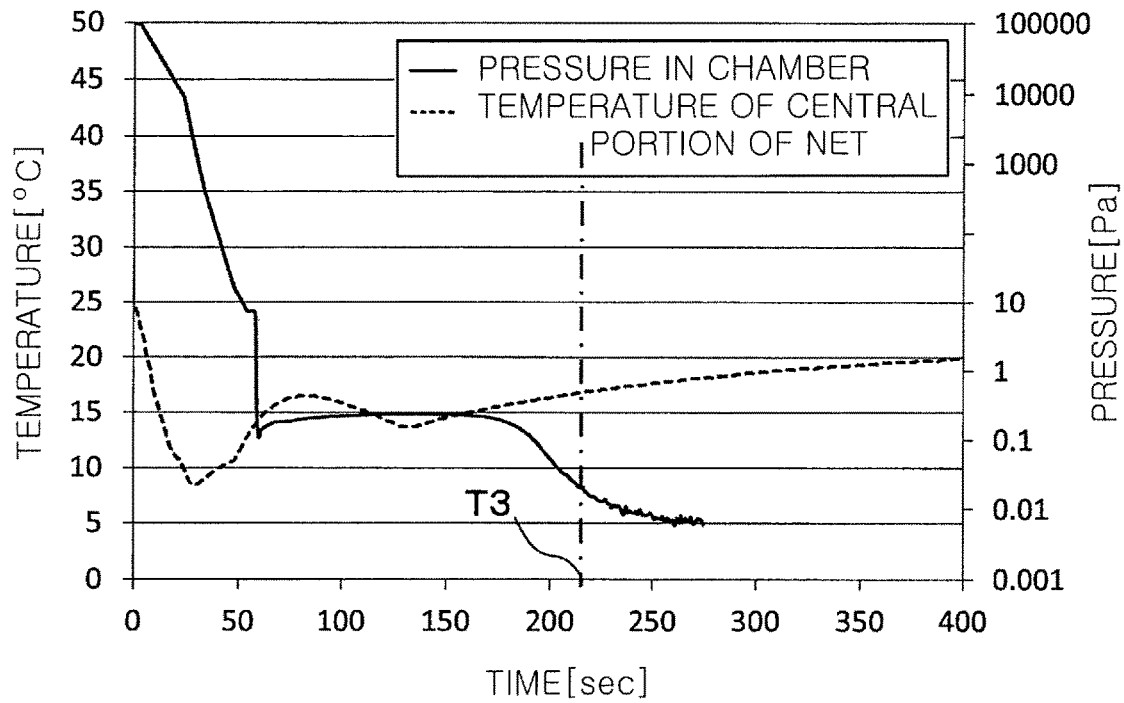

FIGS. 15 to 17 show temporal changes of a pressure in the chamber 10 and a temperature at the central portion of the solvent collecting net 31 in the test example 1. In FIGS. 15 to 17, the horizontal axis represents time and the vertical axis represents a temperature or a pressure.

As shown in FIG. 15, in the test example 1, the temperature at the central portion of the solvent collecting net 31 was monotonically decreased to 8° C. by adiabatic expansion caused by the exhaust operation in the dry pump. When the temperature was 8° C., the pressure in the chamber 10 was $2 \times 10^3$ Pa.

Then, the temperature at the central portion of the solvent collecting net 31 was increased from 8° C. by the radiant heat from the chamber 10 or the like. However, the temperature at the central of the solvent collecting net 31 was 14° C. lower than or equal to the room temperature, i.e., the dew point at the pressure in the chamber 10 at the timing T1 at which the pressure in the chamber 10 reached a vapor pressure (0.2 Pa) of the solvent at the temperature of the substrate, e.g., at the room temperature, after the switching from the exhaust operation in the dry pump to the exhaust operation in the turbo molecular pump.

As shown in FIG. 16, the temperature at the central portion of the solvent collecting net 31 is maintained at a level lower than or equal to the dew point of the solvent S at the pressure in the chamber 10 at each timing until the timing T2 at which the evaporation of the solvent on the substrate is completed, e.g., until the timing at which the pressure in the chamber 10 becomes 0.1 Pa.

As the gas exhaust operation in the turbo molecular pump of the gas exhaust unit 40 continued after the completion of the vaporization of the solvent S on the substrate W, the temperature at the central portion of the solvent collecting net 31 is increased or decreased by the radiant heat from the top plate 12 of the chamber 10 or the like, as shown in FIG. 17. The temperature of the solvent collecting net 31 is increased up to 16° C. which is higher than the dew point (15° C.) of the solvent at the pressure (0.03 Pa) of the chamber 10 at the timing T3 at which 220 seconds has elapsed from the start of the gas exhaust operation which is less than five minutes from the completion of the evaporation of the solvent on the substrate.

Figure 18:
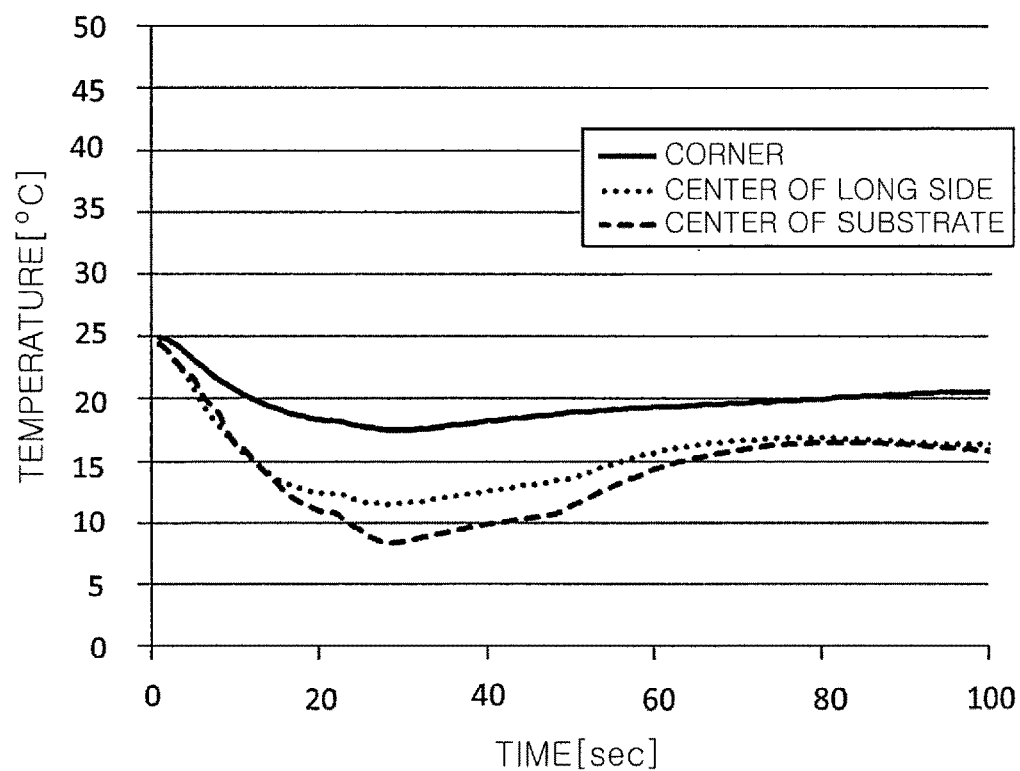
FIG. 18 shows example temporal changes of the pressure in a chamber and the temperatures in respective portions of the solvent collecting net in the test example 1.

FIG. 18 shows temporal changes of a pressure in the chamber 10 and temperatures at respective portions of the solvent collecting net 31 in the test example 1. In FIG. 18, the horizontal axis represents time and the vertical axis represents a temperature. In the following description, a central portion of the solvent collecting net 31, a central portion of a long side, and a corner portion are indicated by points P11, P12 and P13 in FIG. 2B, respectively.

As shown in FIG. 18, the temperature at the central portion P11 of the solvent collecting net 31 is decreased as the pressure in the chamber 10 is decreased.

The temperature at the central portion P12 of the long side and the temperature of the corner portion P13 of the solvent collecting net 31 are also decreased as the pressure in the chamber 10 is decreased. However, the reduction rates of these temperatures are smaller than that of the temperature at the central portion P11 of the solvent collecting net 31. Especially, the lowest temperature at the corner portion P13 is 17° C. The temperature of the solvent collecting net 31 is not uniform because it is difficult to decrease the temperature at the central portion P12 of the long side and at the corner portion P13 due to the low expansion coefficient by the exhaust operation or because it is difficult for air cooled by expansion to flow at the corner portion P13 than at the central portion P12 of the long side in view of the exhaust conductance.

When the solvent collecting net 31 has the temperature distribution profile in which the temperature at the central portion P11 is low and the temperature at the corner portion P13 is high as described above, since the concentration of the gaseous solvent is relatively low at the central portion of the substrate and relatively low at the corner portion of the substrate on the surface of the substrate as a target of the reduced-pressure drying process, the drying time is shorter at the central portion than at the corner portion. Accordingly, the drying time is not uniform. However, in the test example, the drying time is uniform as described above. This is because the drying time of the substrate is shorter at the corner portion than at the central portion of the substrate even if the concentration of the gaseous solvent is uniform above the top surface of the substrate (over the substrate).

The present disclosure provides mechanisms of performing a reduced-pressure drying process on a substrate coated with solution by an inkjet method.

While the disclosure has been shown and described with respect to the embodiments, it will be understood by those skilled in the art that various changes and modifications may be made without departing from the scope of the disclosure as defined in the following claims.

What is claimed is:

1. A reduced-pressure drying apparatus for drying solution on a substrate in a chamber in a depressurized state, the apparatus comprising:
   a solvent collecting unit comprising a net-shaped plate configured to temporarily collect a solvent in the solution vaporized from the substrate, and
   another solvent collecting unit, coupled to a gas exhaust unit configured to depressurize the chamber, disposed in a space between the solvent collecting unit and the gas exhaust unit,
   wherein the solvent collecting unit is configured to face the substrate in the chamber,
   wherein when a pressure in the chamber is decreased to a level lower than or equal to a vapor pressure of the solvent at a temperature of the substrate, a temperature of the solvent collecting unit is decreased to a level lower than or equal to a dew point of the solvent at the pressure in the chamber by a gas in the chamber which is adiabatically expanded by depressurization, wherein the temperature of the solvent collecting unit is maintained at the level lower than or equal to the dew point of the solvent at the pressure in the chamber until vaporization of the solvent of the solution on the substrate is completed, and wherein the other solvent collecting unit is maintained at a temperature lower than a temperature of the solvent collecting unit, and the other solvent collecting unit is configured to temporarily collect the solvent which is vaporized after being temporarily collected in the solvent collecting unit.

2. A reduced-pressure drying apparatus for drying solution on a substrate in a chamber in a depressurized state, the apparatus comprising:

a solvent collecting unit comprising a net-shaped plate configured to temporarily collect a solvent in the solution vaporized from the substrate, and another solvent collecting unit, coupled to a gas exhaust unit configured to set the chamber in a depressurized state, disposed in a space between the solvent collecting unit and the gas exhaust unit, wherein the solvent collecting unit is positioned to face the substrate in the chamber, wherein further the net-shaped plate has an opening ratio of 60% to 80% and a thermal capacity of 850 J/K or less per 1 m$^2$, and wherein the other solvent collecting unit is maintained at a temperature lower than a temperature of the solvent collecting unit, and the other solvent collecting unit is configured to temporarily collect the solvent which is vaporized after being temporarily collected in the solvent collecting unit.

3. The reduced-pressure drying apparatus of claim 2, wherein the net-shaped plate has a thickness in the range of 0.05 mm to 0.2 mm.

4. The reduced-pressure drying apparatus of claim 2, wherein the net-shaped plate is an expanded metal manufactured by slitting and expanding a metal plate.

5. The reduced-pressure drying apparatus of claim 2, wherein the net-shaped plate is made of stainless steel.

6. The reduced-pressure drying apparatus of claim 2, wherein a distance from the substrate to the solvent collecting unit is in the range of 40% to 60% of a distance from the substrate to a top plate of the chamber.

7. The reduced-pressure drying apparatus of claim 2 further comprising an infrared ray emitter disposed in the chamber.

8. A reduced-pressure drying apparatus configured to dry solution on a substrate in a chamber in a depressurized state, the apparatus comprising:

a solvent collecting unit that is a net-shaped plate configured to temporarily collect a solvent in the solution vaporized from the substrate, and another solvent collecting unit coupled to a gas exhaust unit configured to depressurize the chamber, the other solvent collecting unit disposed in a space between the solvent collecting unit and the gas exhaust unit, wherein the solvent collecting unit is disposed to face the substrate in the chamber, wherein a distance from the substrate to the solvent collecting unit is in the range of 40% to 60% of a distance from the substrate to a structure above the solvent collecting unit, and wherein the other solvent collecting unit is maintained at a temperature lower than a temperature of the solvent collecting unit, and the other solvent collecting unit is configured to temporarily collect the solvent which is vaporized after being temporarily collected in the solvent collecting unit.

9. The reduced-pressure drying apparatus of claim 8, wherein the net-shaped plate has a thickness in the range of 0.05 mm to 0.2 mm.

10. The reduced-pressure drying apparatus of claim 8, wherein the net-shaped plate is an expanded metal manufactured by slitting and expanding a metal plate.

11. The reduced-pressure drying apparatus of claim 8, wherein the net-shaped plate is made of stainless steel.

12. The reduced-pressure drying apparatus of claim 8 further comprising an infrared ray emitter disposed in the chamber.

13. A reduced-pressure drying apparatus for drying solution on a substrate in a chamber by using a gas exhaust unit for depressurizing the chamber, the apparatus comprising:

a solvent collecting unit positioned to face the substrate in the chamber and configured to temporarily collect a solvent in the solution vaporized from the substrate; and another solvent collecting unit disposed in a space between the solvent collecting unit and the gas exhaust unit, wherein the other solvent collecting unit is maintained at a temperature lower than a temperature of the solvent collecting unit, and the other solvent collecting unit is configured to temporarily collect the solvent which is vaporized after being temporarily collected in the solvent collecting unit.

14. The reduced-pressure drying apparatus of claim 13, wherein the other solvent collecting unit comprises a cooling mechanism configured to cool the other solvent collecting unit.

15. The reduced-pressure drying apparatus of claim 13, wherein the other solvent collecting unit comprises a heating mechanism configured to heat the other solvent collecting unit.

16. The reduced-pressure drying apparatus of claim 13, wherein the gas exhaust unit comprises a turbo molecular pump and the other solvent collecting unit is configured to be heated by radiant heat from the turbo molecular pump.

17. The reduced-pressure drying apparatus of claim 13, further comprising:

a shield member for opening or closing a gap between a space where the solvent collecting unit is provided and a space where the gas exhaust unit is disposed, wherein the other solvent collecting unit is disposed at a downstream side of the shield member.

18. The reduced-pressure drying apparatus of claim 17, wherein the shield member is an adaptive pressure valve and is disposed in a gas exhaust line coupling the chamber and the gas exhaust unit.

19. The reduced-pressure drying apparatus of claim 17, wherein a mounting table configured to mount thereon the substrate is disposed at a central portion on a bottom plate in the chamber, and wherein the shield member has a shutter configured to open/close a gap between the mounting table and a sidewall of the chamber.

20. The reduced-pressure drying apparatus of claim 17, wherein a mounting table configured to mount thereon the substrate is disposed at a central portion on a bottom plate in the chamber, and wherein the shield member comprises a shutter configured to open/close a gap between the mounting table and a top plate of the chamber.

* * * * *